(12) United States Patent  
Song

(10) Patent No.: US 8,508,683 B2  
(45) Date of Patent: Aug. 13, 2013

(54) LIQUID CRYSTAL DISPLAY AND PANEL THEREFOR

(75) Inventor: Jang-Kun Song, Seoul (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 0 days.

(21) Appl. No.: 13/073,505

(22) Filed: Mar. 28, 2011

(65) Prior Publication Data

US 2011/0170032 A1    Jul. 14, 2011

Related U.S. Application Data

(63) Continuation of application No. 12/749,761, filed on Mar. 30, 2010, now Pat. No. 7,944,515, which is a continuation of application No. 11/682,995, filed on Mar. 7, 2007, now Pat. No. 7,773,169, which is a continuation of application No. 10/916,518, filed on Aug. 12, 2004, now Pat. No. 7,206,048.

(30) Foreign Application Priority Data

Aug. 13, 2003  (KR) ................................. 2003-56067  
Aug. 14, 2003  (KR) ................................. 2003-56546

(51) Int. Cl.  
*G02F 1/1368* (2006.01)  
*G02F 1/1343* (2006.01)

(52) U.S. Cl.  
USPC ............... 349/48; 349/38; 349/129; 349/144

(58) Field of Classification Search  
USPC ................... 349/38, 39, 42, 43, 48, 129, 144; 345/87, 92; 257/59, 72; 313/500, 505  
See application file for complete search history.

(56) References Cited

U.S. PATENT DOCUMENTS

| | | | |
|---|---|---|---|
| 5,576,858 A | 11/1996 | Ukai et al. | |
| 5,748,276 A | 5/1998 | Uno et al. | |
| 5,870,075 A | 2/1999 | Yamazaki et al. | |
| 6,850,302 B2 | 2/2005 | Song | |
| 7,158,201 B2 | 1/2007 | Kim et al. | |
| 2005/0030459 A1 | 2/2005 | Song et al. | |

FOREIGN PATENT DOCUMENTS

| | | |
|---|---|---|
| CN | 1253303 | 5/2000 |
| JP | 01217323 | 8/1989 |
| JP | 03102328 | 4/1991 |
| JP | 04318513 | 11/1992 |
| JP | 05107556 | 4/1993 |
| JP | 08-201777 | 8/1996 |

(Continued)

*Primary Examiner* — Dung Nguyen  
*Assistant Examiner* — Tai Duong  
(74) *Attorney, Agent, or Firm* — F. Chau & Associates, LLC

(57) ABSTRACT

A flat panel display having an improved picture quality is disclosed. In on embodiment, a first pixel electrode and a second pixel electrode are formed in each subpixel area. The electrodes enclose an open space (gap) such that their outer boundary has a substantially rectangular shape. The flat panel display may also include a capacitance electrode coupled to the second pixel electrode to form a coupling capacitor. In use, the coupling capacitor operates such that a magnitude of a voltage applied to the first pixel electrode is lower than an applied data voltage, and a magnitude of a voltage applied to the second pixel electrode is higher than an applied voltage. The different voltages operate such that a tilt direction of LC molecules disposed above the first pixel electrode differs from a tilt direction of LC molecules disposed above the second pixel electrode.

9 Claims, 22 Drawing Sheets

(56) References Cited

FOREIGN PATENT DOCUMENTS

| | | |
|---|---|---|
| JP | 09-269509 | 10/1997 |
| JP | 2001356709 | 12/2001 |
| JP | 2002-072989 | 3/2002 |
| JP | 2002185004 | 6/2002 |
| JP | 2002196342 | 7/2002 |
| JP | 2003-149664 | 5/2003 |
| JP | 2003149664 | 5/2003 |
| JP | 2003-207796 | 7/2003 |
| JP | 2003186038 | 7/2003 |
| JP | 2003207796 | 7/2003 |
| JP | 2003337345 | 11/2003 |
| JP | 2004038165 | 2/2004 |
| JP | 2005004212 | 1/2005 |
| JP | 2005025202 | 1/2005 |
| KR | 2002-0046621 | 6/2002 |
| TW | 295652 | 1/1997 |
| TW | 513604 | 12/2002 |

LIQUID CRYSTAL DISPLAY AND PANEL THEREFOR

CROSS REFERENCE TO RELATED APPLICATIONS

This application is a continuation of U.S. patent application Ser. No. 12/749,761 filed Mar. 30, 2010, now U.S. Pat. No. 7,944,515 which is a continuation of U.S. patent application Ser. No. 11/682,995 filed on Mar. 7, 2007, now U.S. Pat. No. 7,773,169 which is a continuation of U.S. patent application Ser. No. 10/916,518, filed Aug. 12, 2004, now U.S. Pat. No. 7,206,048 which claims priority to Korean Application 2003-0056067, filed Aug. 13, 2003 and to Korean Application 2003-0056546, filed Aug. 14, 2003, the disclosures of which are incorporated by reference herein in their entirety.

BACKGROUND OF THE INVENTION

1. Field of the Invention

The present invention relates to liquid crystal displays generally, and more particularly, to an improved thin film transistor (TFT) panel therefor.

2. Description of Related Art

A liquid crystal display (LCD) is one of the most widely used flat panel displays. A LCD includes two panels provided with field-generating electrodes such as pixel electrodes and a common electrode and a liquid crystal (LC) layer interposed therebetween. The LCD displays images by applying voltages to the field-generating electrodes to generate an electric field in the LC layer, which determines orientations of LC molecules in the LC layer to adjust polarization of incident light.

An example of a LCD is a vertical alignment (VA) mode LCD, which aligns LC molecules such that the long axes of the LC molecules are perpendicular to the panels in the absence of electric field. VA mode LCD's are popular due to their high contrast ratio and wide reference viewing angle. A wide reference viewing angle is either (i) a viewing angle that makes the contrast ratio equal to 1:10 or (ii) a limit angle for the inversion in luminance between grays.

The wide viewing angle of the VA mode LCD can be provided either by cutouts in the field-generating electrodes or by protrusions on the field-generating electrodes. Since the cutouts and the protrusions can determine the tilt directions of the LC molecules, the tilt directions can be distributed into several directions by using the cutouts and the protrusions such that the reference viewing angle is widened.

Although the reference viewing angle can be widened in VA mode LCDs, such LCDs suffer several disadvantages. For example, the quality of lateral visibility is poor as compared with front visibility. For example, in a patterned VA (PVA) mode LCD having cutouts, an image becomes bright as a viewer goes far from the front. In serious cases, the luminance difference between high grays vanishes such that the images cannot be perceived.

Additionally, VA mode LCDs often have poor response times. For example, although the LC molecules near the cutouts or protrusions rapidly tilt in a direction in response to a strong fringe field, the LC molecules far from the cutouts or protrusions may experience a weak fringe field and may not rapidly determine the tilt directions. Accordingly, the LC molecules far from the cutouts or protrusions are pushed or collided by adjacent molecules to be tilted. Narrowing the distance between the cutouts may improve response times, but it may also reduce the aperture ratio.

SUMMARY OF THE INVENTION

The invention is directed to a flat panel display having an improved picture quality. In one embodiment the flat panel display includes a common electrode formed of a transparent conductive material and having at least one cutout therein. One or more pixel areas are positioned under the common electrode, and each pixel area includes one or more subpixel areas. A liquid crystal (LC) layer is disposed between the common electrode and the one or more subpixel areas, and the LC layer includes a plurality of LC molecules.

In each subpixel area, a first pixel electrode and a second pixel electrode are formed that engage with each other and enclose an open space (gap) such that their outer boundary has a substantially rectangular shape. The first pixel electrode includes a pair of right-angled triangular shaped portions facing one or more oblique edges of the second pixel electrode and also includes a longitudinal portion facing a side edge of the second pixel electrode. The second pixel electrode has a shape that approximates an equilateral trapezoid. The second electrode may also have an edge thereof disposed proximate a first storage electrode and another edge disposed proximate a second storage electrode. The gap formed between the first and second electrodes is disposed between the at least one cutout formed in the common electrode and an opening that separates a pixel area from another of the one or more pixel areas.

The flat panel display may also include a capacitance electrode coupled to the second pixel electrode to form a coupling capacitor. In use, the coupling capacitor operates such that a magnitude of a voltage applied to the first pixel electrode is lower than an applied data voltage, and a magnitude of a voltage applied to the second pixel electrode is higher than an applied voltage. The different voltages operate such that a tilt direction of LC molecules disposed above the first pixel electrode differs from a-tilt direction of LC molecules disposed above the second pixel electrode.

DETAILED DESCRIPTION OF EMBODIMENTS

Figure 1:
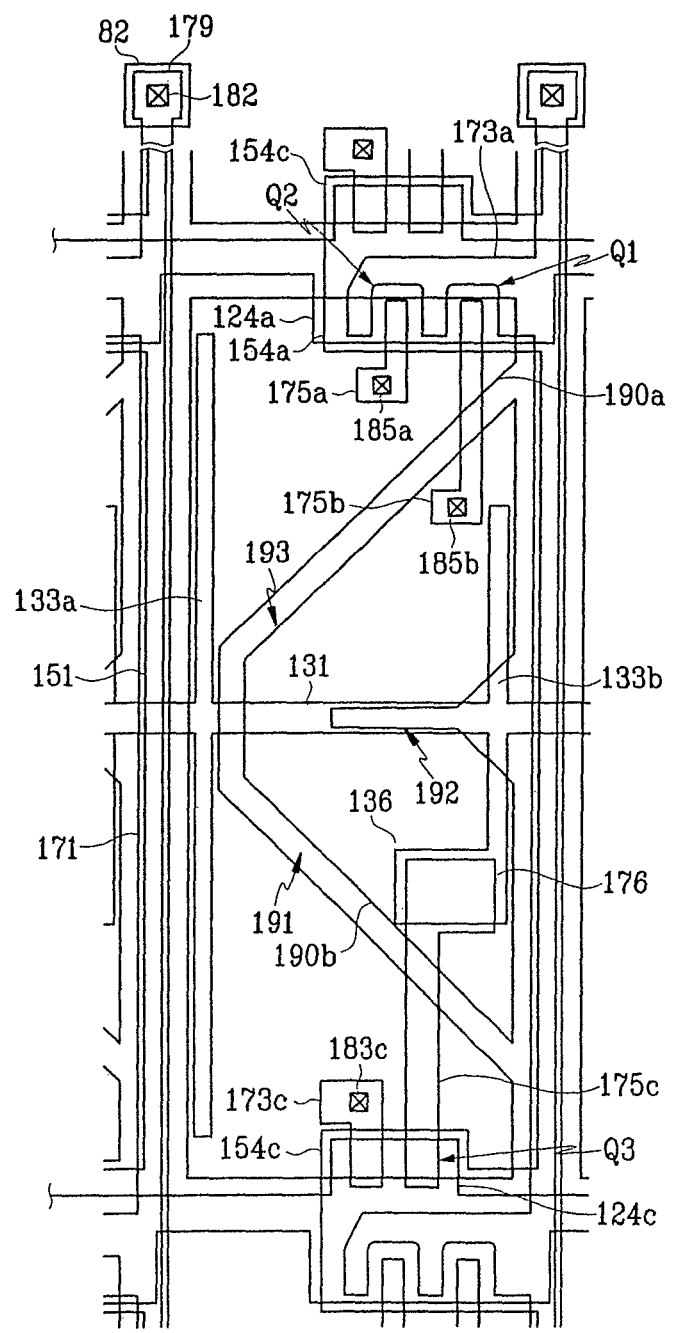
FIG. 1 is a top view of a TFT array panel of a LCD according to an embodiment of the present invention.

The present invention is described more fully hereinafter with reference to the accompanying drawings, in which preferred embodiments of the invention are shown. The present invention may, however, be embodied in many different forms and should not be construed as limited to the embodiments set forth herein.

In the drawings, the thickness of layers, films and regions are exaggerated for clarity. Like numerals refer to like elements throughout. It will be understood that when an element such as a layer, film, region or substrate is referred to as being "on" another element, it can be directly on the other element or intervening elements may also be present. In contrast, when an element is referred to as being "directly on" another element, there are no intervening elements present.

Figure 2:
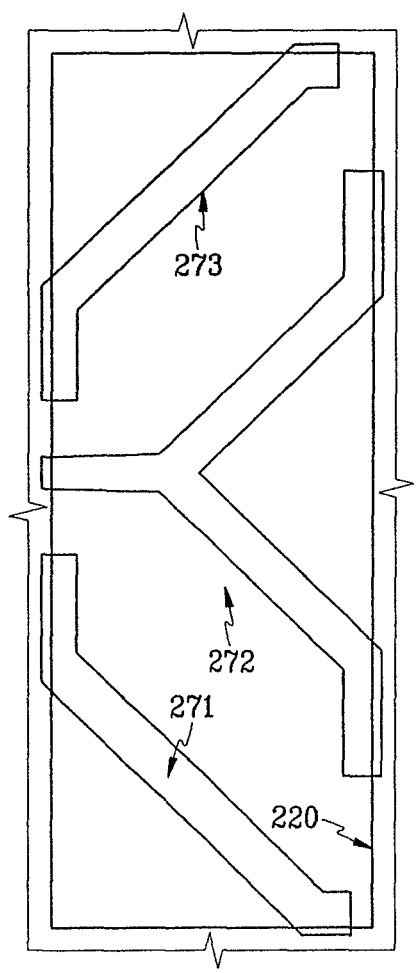
FIG. 2 is a top view of a common electrode panel of a LCD according to an embodiment of the present invention.
Figure 3:
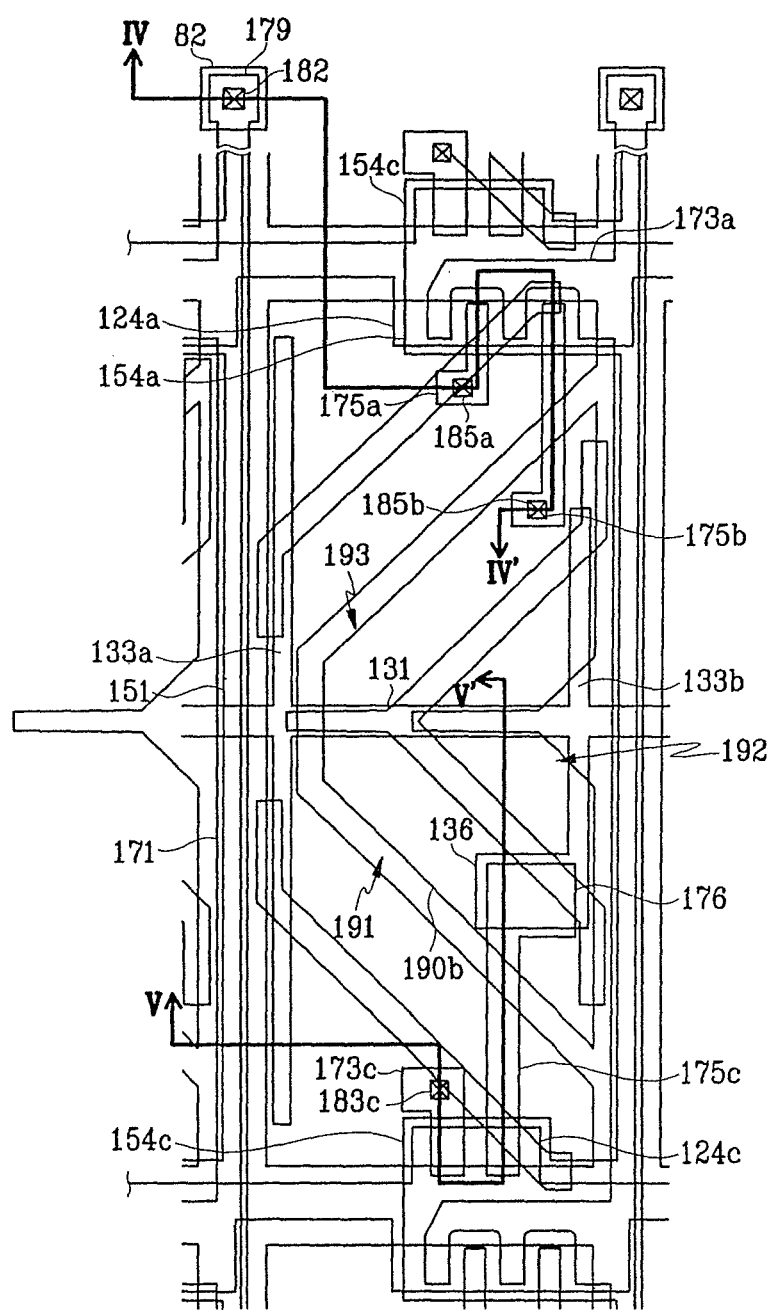
FIG. 3 is a top view of a LCD including the TFT array panel shown in FIG. 1 and the common electrode panel shown in FIG. 2.
Figure 4:
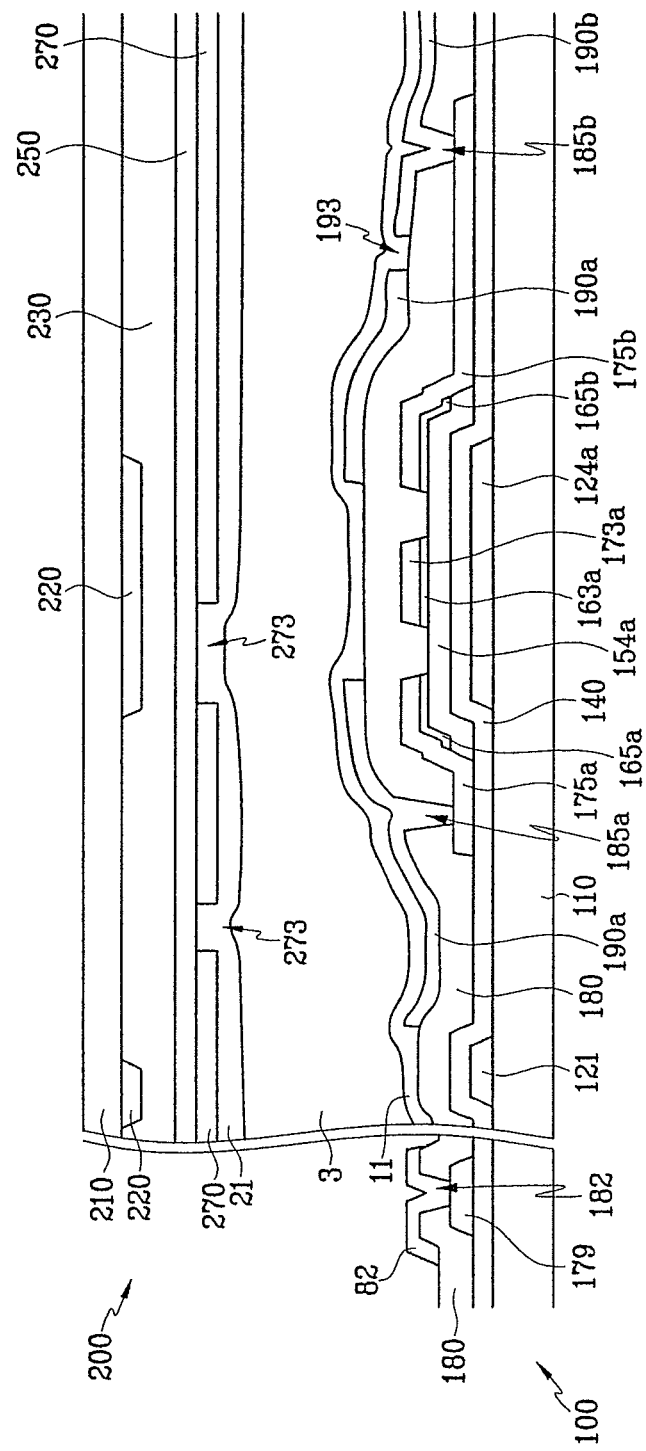
FIGS. 4 and 5 are sectional views of the LCD shown in FIG. 3 taken along the lines IV-IV' and V-V', respectively.
Figure 5:
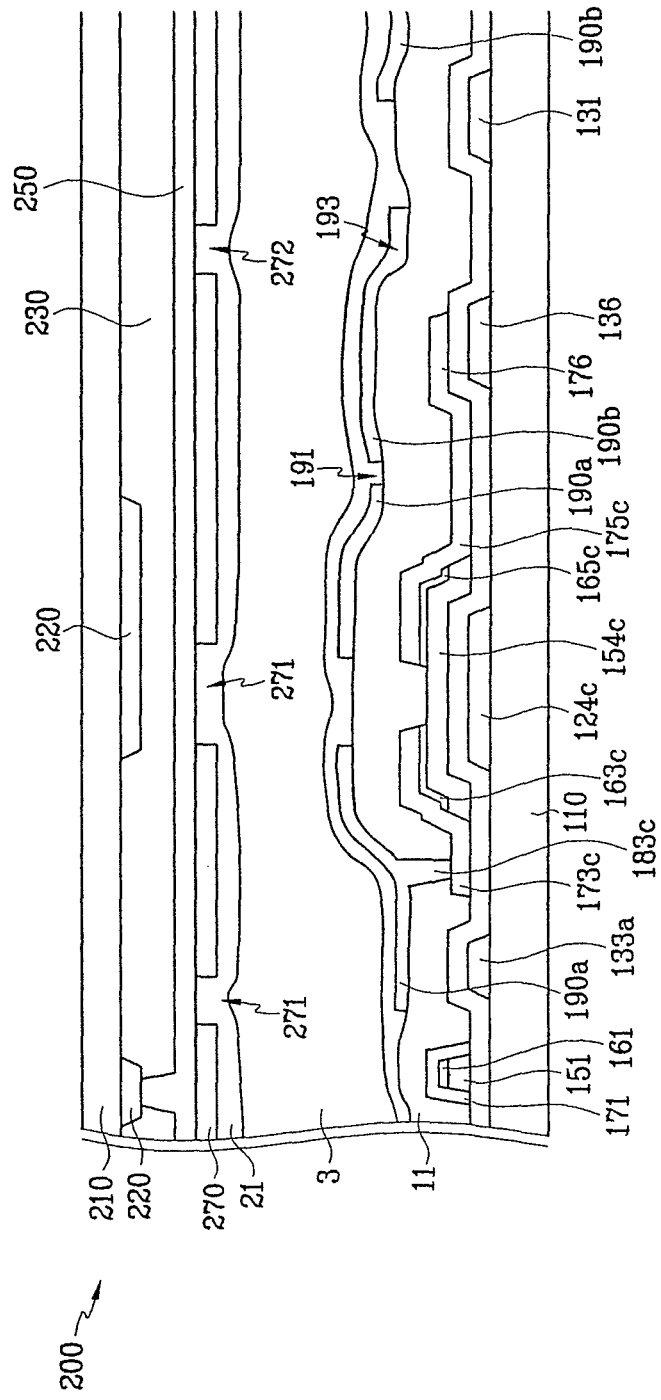

A LCD according to an embodiment of the present invention is described in detail with reference to FIGS. 1-6. FIG. 1 is a top view of a TFT array panel of a LCD according to an embodiment of the present invention. FIG. 2 is a top view of a common electrode panel of a LCD according to an embodiment of the present invention. FIG. 3 is a top view of a LCD including the TFT array panel shown in FIG. 1 and the common electrode panel shown in FIG. 2. FIGS. 4 and 5 are sectional views of the LCD shown in FIG. 3 taken along the lines IV-IV' and V-V', respectively.

Referring to FIG. 1, a LCD according to an embodiment of the present invention includes a TFT array panel 100, a common electrode panel 200, and a LC layer 3 interposed between the panels 100 and 200 and containing a plurality of LC molecules aligned substantially vertical to surfaces of the panels 100 and 200.

FIGS. 1 and 3-5 illustrate one embodiment of a TFT array panel 100 according to the invention. As shown, a plurality of gate lines 121 and a plurality of storage electrode lines 131 are formed on an insulating substrate 110 such as transparent glass.

The gate lines 121 are configured to transmit gate signals and extend in a substantially transverse direction. Additionally the gate lines 121 are separated from each other. Each gate line 121 includes a plurality of first electrodes 124a protruding downward and second gate electrodes 124c protruding upward. The gate lines 121 may extend to be connected to a driving circuit (not shown) integrated on the substrate 110. Alternatively, one or more of the plurality of gate lines may have an end portion (not shown) having a large area for connection with (i) another layer, or (ii) an external driving circuit, which may be mounted on the substrate 110 or mounted on another device, such as a flexible printed circuit film (not shown), that may be attached to the substrate 110.

Each storage electrode line 131 also extends in the substantially transverse direction and is substantially equidistant from adjacent gate lines 121. Each storage electrode line 131 includes a plurality of pairs of branches forming storage electrodes 133a and 133b. Each branch pair includes a first storage electrode 133a and a second storage electrode 133b, both of them are extending upward and downward. Illustratively, the first storage electrode 133a is much longer than the second storage electrode 133b such that both ends of the first storage electrode 133a are disposed close to the gate lines 121, while both ends of the second storage electrode 133b are disposed approximately at midpoint between the gate lines 121 and the storage electrode line 131. The second storage electrode 133b has an expansion 136 at its lower end. The storage electrode lines 131 are supplied with a predetermined voltage such as a common voltage, which is applied to a common electrode 270 on the common electrode panel 200 of the LCD. Each storage electrode line 131 may include two stems extending in the transverse direction and positioned close to the gate lines 121.

In one embodiment, the gate lines 121 and the storage electrode lines 131 are each preferably made of (i) an Al containing metal (such as Al or an Al alloy), (ii) a Ag containing metal (such as Ag or a Ag alloy), (iii) a Cu containing metal (such as Cu or a Cu alloy), (iv) a Mo containing metal (such as Mo and Mo alloy). Additionally, each of the gate lines 121 and the storage electrode lines 131 may be formed of materials such as, but not limited to, Cr, Ti or Ta.

The gate lines 121 and the storage electrode lines 131 may have a multi-layered structure that includes two films, a lower film (not shown) and an upper film (not shown), having different physical characteristics. In an exemplary embodiment, the upper film is preferably made of a low resistivity metal, such as, but not limited to, an Al containing metal such as Al or an Al alloy. A low resistivity metal is used in the upper layer to reduce signal delay or voltage drop in the gate lines 121 and the storage electrode lines 131. On the other hand, the lower film may be preferably made of material such as Cr, Mo, or a Mo alloy, which has good contact characteristics with other materials such as, but not limited to, indium tin oxide (ITO) or indium zinc oxide (IZO). In other embodiments, the gate lines 121 and the storage electrode lines 131 may be made of other various metals or conductive materials.

In some embodiments, the lateral sides of the gate lines 121 and the storage electrode lines 131 may be inclined at an inclination angle in the range of about 30-80 degrees, relative to a surface of the substrate.

Additionally, a gate insulating layer 140 preferably made of silicon nitride (SiNx) may be formed on the gate lines 121 and the storage electrode lines 131.

A plurality of semiconductor strips 151 preferably made of hydrogenated amorphous silicon (abbreviated to "a-Si") or polysilicon are then formed on the gate insulating layer 140. As illustratively shown, each semiconductor strip 151 may extend substantially in the longitudinal direction and have a plurality of projections 154a and 154c branched out toward the first and the second gate electrodes 124a and 124c.

In one embodiment, a plurality of ohmic contact strips 161 and ohmic contact islands 163c and 165a-165c, which may be made of silicide or n+ hydrogenated a-Si heavily doped with n type impurity such as phosphorous, are formed on the semiconductor strips 151. Each ohmic contact strip 161 has a plurality of projections 163a, and the projections 163a and the ohmic contact islands 165a and 165b are located in sets on the projections 154a of the semiconductor strips 151. The ohmic contact islands 163c and 165c may be located in pairs on the projections 154c of the semiconductor strips 151.

Additionally, in one embodiment, the lateral sides of the semiconductor strips 151 and the ohmic contacts 161 and 165 are inclined at an inclination angles in a range about 30-80 degrees relative to a surface of the substrate.

In the embodiment shown in FIG. 5, a plurality of data lines 171 are formed on a corresponding plurality of ohmic contacts 161. As shown in FIG. 4, a plurality of first source electrodes 173a are formed on a corresponding plurality of ohmic contacts 163a. Additionally, a plurality of first drain electrodes 175a and second drain electrodes 175b are formed on corresponding pluralities of ohmic contacts 165a and 165b, respectively. Referring again to FIG. 5, a plurality of second source electrodes 173c are formed on the ohmic contacts 163c, and a plurality of third drain electrodes 175c are formed on the ohmic contacts 165c.

Referring back to FIG. 1, the data lines 171 for transmitting data voltages may extend in a substantially longitudinal direction to intersect the gate lines 121 and the storage electrode lines 131. Each data line 171 is disposed between adjacent branch sets 133a and 133b and includes an end portion 179 having a large area for contact with another layer or an external device.

As shown in FIG. 1, each data line 171 may include a plurality of branches that project toward the first and the second drain electrodes 175a and 175b. These branches form the first source electrodes 173a, which are disposed on the ohmic contacts 163a.

The first drain electrodes 175a have one end portion respectively disposed on the ohmic contact 165a opposite the first gate electrodes 124a. Additionally, the second drain electrodes 175b have one end portion respectively disposed on the ohmic contact 165b opposite the first gate electrodes 124a. Both pluralities of drain electrodes 175a and 175b extend downward and substantially parallel to each other and have other end portions expanded for contact with another layer. As illustratively shown, the length of the second drain electrodes 175b may be longer than that of the first drain electrodes 175a such that the expanded end portions of the second drain electrodes 175b are located near the ends of the second storage electrodes 133b. Each of the first source electrodes 173a may be twice curved such that the two curved portions partly enclose the end portions of the first and the second drain electrodes 175a and 175b, respectively.

Referring to the bottom area of FIG. 1, the second source electrodes 173c have one end disposed on ohmic contacts 163 opposite the second gate electrodes 124. The third drain electrodes 175c have one end disposed on the ohmic contacts 165c opposite the second gate electrodes 124c. Both the second source electrodes 173c and the third drain electrodes 175c extend upward and substantially parallel to each other. Each of the second source electrodes 173c has another end portion expanded for contact with another layer, and each of the third drain electrodes 175c has an expanded end portion 176 called a coupling electrode overlapping the expansion connector 136 of a storage electrode 133b.

Referring to a top portion of FIG. 1, a first TFT "Q1" is formed by first gate electrode 124a, a first source electrode 173a, along with a projection 154a of a semiconductor strip 151. A second TFT "Q2" is formed by a first gate electrode 124a, a first drain electrode 175, along with a projection 154a of a semiconductor strip 151. A channel is formed in a portion of the projection 154a that is disposed between the first source electrode 173a and the first/second drain electrodes 175a/175b. Similarly, referring to a bottom portion of FIG. 1, a second gate electrode 124c, a second source electrode 173c, and a third drain electrode 175c along with a projection 154c of the semiconductor strip 151 form a third TFT Q3 having a channel formed in a portion of the projection 154c disposed between the second source electrode 173c and the third drain electrode 175c.

The data lines 171, the second source electrodes 173c, and the drain electrodes 175a-175c are preferably made of refractory metal such as, but not limited to, Cr, a Mo containing metal, Ti, a Ti containing metal, or an Al containing metal. Each of these elements may have a multilayered structure including a lower film (not shown) preferably made of refractory metal and an upper film (not shown) located thereon and preferably made of low resistivity material.

Like the gate lines 121 and the storage electrode lines 131, the data lines 171, the second source electrodes 173c, and the drain electrodes 175a-175c may have tapered lateral sides, and inclination angles in the range of about 30-80 degrees.

The ohmic contacts 161, 163a and 165a-165c are interposed only between (i) the underlying semiconductor strips 151 and the overlying data lines 171, and (ii) between the second source electrodes 173c and the overlying drain electrodes 175a-175c thereon to reduce the contact resistance therebetween. The semiconductor strips 151 may include a plurality of exposed portions, which are not covered with the data lines 171, the second source electrodes 173c, or the drain electrodes 175a-175c. Illustratively, such exposed portions may be located between the source electrodes 173a and 173c and the drain electrodes 175a-175c.

Referring to FIG. 4, a passivation layer 180 may be formed on the data lines 171, the second source electrodes 173c, and the drain electrodes 175a-175c, and the exposed portions of the semiconductor strips 151. In one embodiment, the passivation layer 180 is preferably made of photosensitive organic material having good flatness characteristics. Illustratively, such a material may include a low dielectric insulating material having a dielectric constant lower than about 4.0, such as, but not limited to, a-Si:C:O and a-Si:O:F. Such materials may be formed by plasma enhanced chemical vapor deposition (PECVD). Alternatively, the material may include an inorganic material such as silicon nitride. The passivation layer 180 may include a lower film formed of an inorganic insulator and an upper film formed of an organic insulator.

As shown in FIG. 5, the passivation layer 180 has a plurality of contact holes 182, 183c, 185a and 185b exposing the end portions 179 of the data lines 171, the expanded end portions of the second source electrodes 173c, and the expanded end portions of the first and the second drain electrodes 175a and 175b, respectively.

In one embodiment, a plurality of pairs of first and second pixel electrodes 190a and 190b and a plurality of contact assistants 82, which are preferably made of a transparent conductor such as ITO and IZO or a reflective conductor such as Al, are formed on the passivation layer 180.

The first/second pixel electrodes 190a/190b are physically and electrically connected to the first/second drain electrodes 175a/175b through the contact holes 185a/185b such that the first/second pixel electrodes 190a/190b receive the data voltages from the first/second drain electrodes 175a/175b. In addition, the first pixel electrodes 190a are connected to the second source electrodes 173c through the contact holes 173c, and the second pixel electrodes 190b overlap the coupling electrodes 176 connected to the third drain electrode 175c.

When supplied with data voltages, the pixel electrodes 190a and 190b generate electric fields in cooperation with the common electrode 270, which reorient liquid crystal molecules in the liquid crystal layer 3.

A pixel electrode 190a/190b and the common electrode 270 form a liquid crystal capacitor, which stores applied voltages after the TFT turns off. An additional capacitor called a "storage capacitor," which is connected in parallel to the liquid crystal capacitor, is provided for enhancing the voltage storing capacity. The storage capacitors are implemented by overlapping the pixel electrodes 190a and 190b with the storage electrode lines 131 and the storage electrodes 133a and 133b.

Referring to FIGS. 1 and 3, a pair of first and second pixel electrodes 190a and 190b engage with each other and enclose an open space (hereinafter, "gap") such that their outer boundary has a substantially rectangular shape. In one embodiment, the second pixel electrode 190b may be shaped like a rotated equilateral trapezoid. The second pixel electrode may have a left edge thereof disposed near a first storage electrode 133a, a right edge disposed near a second storage electrode 133b, and a pair of upper and lower oblique edges, each making an angle of about 45 degrees with the gate lines 121.

The first pixel electrode 190a may include a pair of right-angled triangular portions facing the oblique edges of the second pixel electrode 190b and a longitudinal portion facing the left edge of the second pixel electrode 190b. Accordingly, a gap between the first pixel electrode 190a and the second pixel electrode 190b may include a pair of oblique lower and upper portions 191 and 193, each having a substantially uniform width and making an angle of about 45 degrees with the gate lines 121. The gap may also include a longitudinal portion having a substantially uniform width. As shown, the oblique portions 191 and 193 are longer than the longitudinal portion.

As shown in FIG. 1, the second pixel electrode 190b may have a cutout 192 extending along the storage electrode line 131 to bisect the second pixel electrode 190 into lower and upper partitions. The cutout 192 may have an inlet from the right edge of the second pixel electrode 190b. Additionally, the inlet of the cutout 192 may have a pair of inclined edges substantially parallel to the lower oblique portion 191 and the upper oblique portion 193 of the gap, respectively. The gaps 191 and 193 and the cutout 192 substantially have inversion symmetry with respect to the storage electrode line 131.

The number of partitions or the number of the cutouts may vary depending on design factors such as the size of pixels, the ratio of the transverse edges and the longitudinal edges of the first and second pixel electrodes 190a and 190b, the type and characteristics of the liquid crystal layer 3, and so on. For descriptive convenience, the gaps 191 and 193 may sometimes be referred to as cutouts. Thus, in one embodiment, the storage electrode lines 131 may further include a plurality of branches (not shown) overlapping the cutouts 191-193.

As illustratively shown in FIG. 1, the contact assistants 82 may be connected to the end portions 179 of the data lines 171 through the contact holes 182. The contact assistants 82 protect the end portions 179 and complement the adhesion between the end portions 179 and external devices.

The description of the common electrode panel 200 follows with reference to FIGS. 2-5.

Referring to FIGS. 4 and 5, a light blocking member 220 called a black matrix for preventing light leakage is formed on an insulating substrate 210 such as transparent glass. The light blocking member 220 may include a plurality of openings that face the pixel electrodes 190 and it may have substantially the same shape as the pixel electrodes 190. However, the light blocking member 220 may have a variety of shapes for blocking light leakage near the pixel electrodes 190a and 190b and the TFTs Q1-Q3, shown in FIG. 1.

A plurality of color filters 230 may be formed on the substrate 210 and disposed substantially in the areas enclosed by the light blocking member 220. The color filters 230 may extend substantially along the longitudinal direction along the pixel electrodes 190. The color filters 230 may represent one of the primary colors such as red, green and blue colors.

An overcoat 250 for preventing the color filters 230 from being exposed and for providing a flat surface may be formed on the color filters 230 and the light blocking member 220.

A common electrode 270, preferably made of transparent conductive material such as ITO or IZO, may be formed on the overcoat 250, and may include a plurality of sets of cutouts 271-273, as illustratively shown in FIGS. 2 and 4.

Referring to FIG. 2, set of cutouts 271-273 face a pixel electrode 190 and include a lower cutout 271, a center cutout 272, and an upper cutout 273. Each of the cutouts 271-273 is disposed between adjacent cutouts 191-193 (FIG. 1) of the pixel electrode 190 or between a cutout 191 or 193 and a chamfered edge of the pixel electrode 190. In addition, each of the cutouts 271-273 has at least an oblique portion extending parallel to the lower cutout 191 or the upper cutout 193 of the pixel electrode 190, and the distances between adjacent two of the cutouts 271-273 and 191-193, the oblique portions thereof, the oblique edges thereof, and the chamfered edges of the pixel electrode 190, which are parallel to each other, are substantially the same. The cutouts 271-273 substantially have inversion symmetry with respect to a third storage electrode 133c.

As shown in FIG. 2, each of the lower and upper cutouts 271 and 273 may include an oblique portion extending approximately from a left edge of the pixel electrode 190 approximately to a lower or upper edge of the pixel electrode 190, and transverse and longitudinal portions extending from respective ends of the oblique portion along edges of the pixel electrode 190, to overlap the edges of the pixel electrode 190, and make obtuse angles with the oblique portion.

In one embodiment, the center cutout 272 may also include a central transverse portion extending approximately from the left edge of the pixel electrode 190 along the third storage electrode 133c, a pair of oblique portions extending from an end of the central transverse portion approximately to a right edge of the pixel electrode and making obtuse angles with the central transverse portion, and a pair of terminal longitudinal portions extending from the ends of the respective oblique portions along the right edge of the pixel electrode 190. The pair of longitudinal portions may overlap the right edge of the pixel electrode 190, and make obtuse angles with the respective oblique portions.

The number of the cutouts 271-273 may vary depending on design factors. Similarly, in one embodiment, the light blocking member 220 may also overlap the cutouts 271-273 to block the light leakage through the cutouts 271-273.

Referring to FIGS. 4 and 5, alignment layers 11 and 21 for aligning the LC molecules may be coated on inner surfaces of the panels 100 and 200. Crossed polarizers 12 and 22 are provided on outer surfaces of the panels 100 and 200, respectively, such that a transmissive axis of one of the polarizers 12 and 22 is parallel to the transverse direction. The term "crossed" includes a configuration here a transmissive axis of one polarizer is opposite a transmissive axis of the other polarizer. One of the polarizers may be omitted when the LCD is a reflective LCD.

In one embodiment, the LC layer 3 has negative dielectric anisotropy, and the LC molecules in the LC layer 3 are aligned such that their long axes are substantially vertical to the surfaces of the panels in absence of electric field.

As mentioned above, a set of the cutouts 191-193 and 271-273 divides a pair of first and second pixel electrodes 190a and 190b into a plurality of subareas. As shown in FIG. 3, each subarea has two major edges. The cutouts 191-193 and 271-273 control the tilt directions of the LC molecules in the LC layer 3, which is further described below. Additionally, the cutouts 191-193 and 271-273 of the electrodes 190a, 190b and 270 distort the electric fields to have a horizontal component. The horizontal components of the electric fields are perpendicular to the edges of the cutouts 191-193 and 271-273. Accordingly, the tilt directions of the LC molecules on the subareas are different and thus the reference viewing angle is enlarged.

At least one of the cutouts 191-193 and 271-273 can be substituted with protrusions or depressions, and the shapes and the arrangements of the cutouts 191-193 and 271-273 may be modified.

Furthermore, and the shape and the position of the coupling electrode 176 may be modified.

Figure 6:
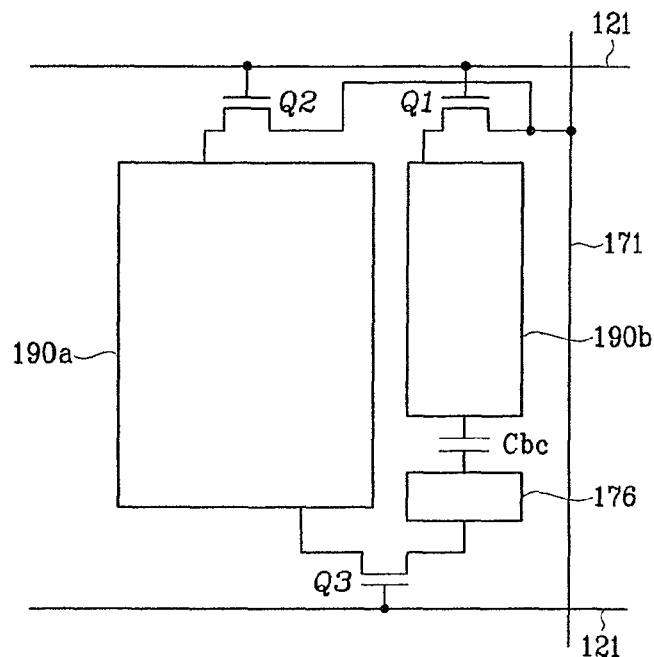
FIG. 6 is a schematic equivalent circuit diagram of the TFT array panel shown in FIGS. 1-5.

FIG. 6 depicts the TFT array panel 100 of FIGS. 1-5 as a schematic equivalent circuit. As shown in FIG. 6, the TFT array panel 100 includes a plurality of gate lines, a plurality of data lines, and a plurality of pixels. Each pixel includes a pair of first and second pixel electrodes 190a and 190b, first, second, and third TFTs Q1-Q3, and a coupling electrode 176. As previously described the first/second TFT Q1/Q2 is connected to a gate line, a data line supplied with data voltages, and the first/second pixel electrode 190a/190b. The third TFT Q3 is connected to a gate line adjacent the gate line that is connected to the first and the second TFTs Q1 and Q2. The third TFT Q3 is also connected to the first pixel electrode 190a and the coupling electrode 176. The coupling capacitor electrode 176 is capacitively coupled to the second pixel electrode 190b to form a coupling capacitor Cbc.

Now, an illustrative behavior of one embodiment of a pixel is described in detail.

When the gate line connected to the first and the second TFTs Q1 and Q2 is supplied with a gate-on voltage, the first and the second TFT Q1 and Q2 turn on to transmit a data voltage to the first and the second pixel electrodes 190a and 190b. At this time, the coupling electrode 176 that is capacitively coupled to the second pixel electrode 190b and has a voltage charged in a previous frame may change its voltage. When the gate line is supplied with a gate-off voltage, the first and the second pixel electrodes 190a and 190b become floating. When the adjacent gate line connected to the third TFT Q3 is supplied with the gate-on voltage, the third TFT Q3 turns on to electrically connect the first pixel electrode 190a and the coupling electrode 176 such that the first pixel electrode 190a and the coupling electrode 176 have an equal voltage. The capacitive coupling between the coupling electrode 176 and the second pixel electrode 190b also changes the voltage of the second pixel electrode 190b. As a result, the magnitude of the voltage of the first pixel electrode 190a with respect to the common voltage becomes lower than the initial data voltage, while the magnitude of the voltage of the second pixel electrode 190b with respect to the common voltage becomes higher than the initial data voltage. In this manner, the first and the second pixel electrodes 190a and 190b have different voltages, which reduces the distortion of gamma curves and improves picture quality. These improvements are described in more detail with reference to FIG. 7.

Figure 7:
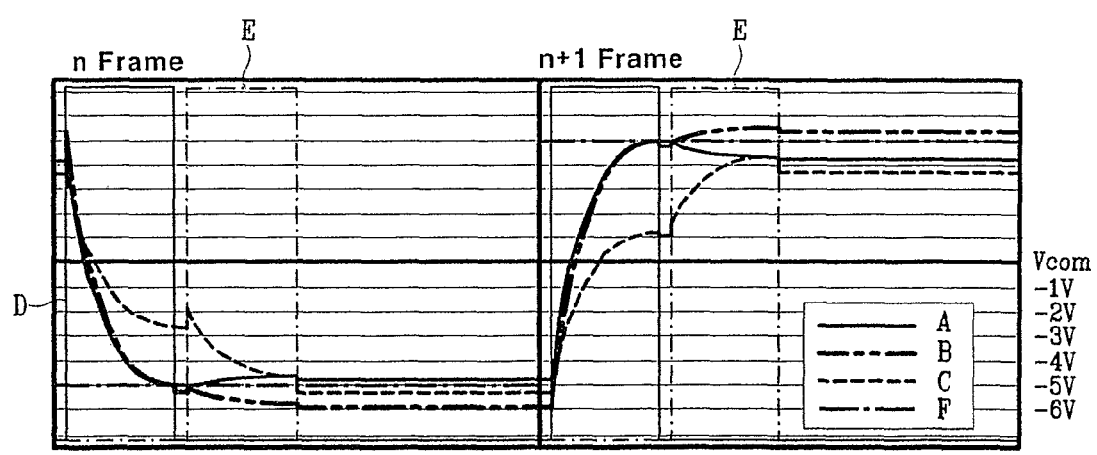
FIG. 7 illustrates time variation of several voltages in the LCD of FIGS. 1-6.

FIG. 7 illustrates time variation of several voltages in the LCD of FIGS. 1-6. In FIG. 7, the characters "A" and "B" represent the voltages of first and second pixel electrodes 190a and 190b, respectively. The character "C" represents the voltage of a coupling electrode 176. The characters "D" and "E" represent gate signals applied to a gate line 121 and a next gate line 121, respectively. And, the character "F" represents data voltages applied to a data line 171. The character Vcom indicates the voltage of the common electrode 270.

As shown in FIG. 7, five voltage changes were observed for each of subsequent two frames, i.e., the n-th and the (n+1)-th frames.

In one experiment, at the time the gate line connected to the first and the second TFTs Q1 and Q2 was supplied with a gate-on voltage to turn on the first and the second TFTs Q1 and Q2, the voltages A, B and C of the first and the second pixel electrodes 190a and 190b and the coupling electrode 176 were slightly changed due to the kickback caused by the parasitic capacitances between the drain electrodes 175a and 175b and the gate electrode 124a of the first and the second TFTs Q1 and Q2.

After the first and the second TFTs Q1 and Q2 turned on to transmit the data voltage F having negative polarity with respect to the common voltage Vcom, the voltages A and B of the first and the second pixel electrodes 190a and 190b were changed to have the same value with the data voltage F. At this time, the voltage C of the coupling electrode 176 was also changed by the capacitive coupling with the second pixel electrode 190b. However, the change in the voltage C was smaller than the change in the voltages A and B of the first and the second pixel electrodes 190a and 190b such that the voltage C with respect to the common voltage Vcom was smaller than the voltages A and B with respect to the common voltage Vcom.

At the time that the gate line was supplied with a gate-off voltage to turn off the first and the second TFTs Q1 and Q2, the voltages A, B and C of the first and the second pixel electrodes 190a and 190b and the coupling electrode 176 were slightly varied again due to the kickback.

At the time that the next gate line connected to the third TFT Q3 was supplied with the gate-on voltage to turn on the third TFT Q3, the voltages A, B and C of the first and the second pixel electrodes 190a and 190b and the coupling electrode 176 were slightly varied due to the kickback caused by the parasitic capacitances between the drain electrode 175c and the gate electrode 124b of the third TFT Q3.

After the third TFT Q3 turned on to electrically connect the first pixel electrode 190a and the coupling electrode 176, the voltages A and C of the first pixel electrode 190a and the coupling electrode 176 became equal to each other and the voltage B of the second pixel electrode 190b was also changed. In detail, the voltage A of the first pixel electrode 190a became increased, while the voltage B of the second pixel electrode 190b became decreased. In terms of absolute values of the voltages A and B subtracted by the common voltage Vcom, the voltage A of the first pixel electrode 190a was decreased, while the voltage B of the first pixel electrode 190b was increased. In other words, .vertline.A-Vcom.vertline. was decreased from .vertline.F-Vcom.vertline. and .vertline.B-Vcom.vertli-ne. was increased from .vertline.F-Vcom.vertline.

At the time that the next gate line was supplied with the gate-off voltage to turn off the third TFT Q3, the voltages A, B and C of the first and the second pixel electrodes 190a and 190b and the coupling electrode 176 were slightly varied again due to the kickback. However, .vertline.A-Vcom.vertline. was still smaller than .vertline.F-Vcom.vertli-ne. and .vertline.B-Vcom.vertline. was still larger than .vertline.F-Vcom.vertline.

In one embodiment, the magnitude of the voltage difference between the first and the second pixel electrodes 190a and 190b may be determined by several capacitances. For example, by the capacitance of the coupling capacitor Cbc (hereinafter referred to as "coupling capacitance" and also denoted by reference designator "Cbc") and the storage capacitance (hereinafter, denoted by "Cstc") between the coupling electrode 176 and the expansion 136 of the second storage electrode 133b. In one embodiment, the storage capacitance Cstc between the coupling electrode 176 and the expansion 136 of the second storage electrode 133b preferably ranges about {fraction (1/10)}-1/3 of the storage capacitance (hereinafter, denoted by "Csta") between the first pixel electrode 190a and the storage electrode lines 131. In addition, the coupling capacitance Cbc is preferably similar to the storage capacitance Cstc. In one particular embodiment, one of the capacitances Cbc and Cstc is preferably about two times smaller than the other of the capacitances Cbc and Cstc.

Additionally, in one embodiment, it is preferable that the coupling electrode 176 be fully covered with the second pixel electrode 190b such that the capacitance between the coupling electrode 176 and the common electrode 270 substantially vanishes. The simultaneous overlapping of the coupling electrode 176, the second pixel electrode 190b, and the storage expansion 136 yields a maximum aperture ratio. However, in other embodiments, the storage expansion connector 136 need not overlap the coupling electrode 176, and the arrangement and the shape of the storage electrode line 131 and the coupling electrode 176 may have various modifications.

Furthermore, in another embodiment, it is preferable that the parasitic capacitance (denoted by "Cgda" hereinafter) between the first drain electrode 175a and the first gate electrode 124a have a magnitude similar to the parasitic capacitance (denoted by "Cgdb" hereinafter) between the second drain electrode 175b and the first gate electrode 124a. Additionally, the parasitic capacitance (denoted by "Cgdc" hereinafter) between the third drain electrode 175c and the second gate electrode 124b may be larger than the parasitic capacitance Cgdb.

Next, a relation between the voltages of the first and the second pixel electrodes 190a and 190b and the data voltage is described in detail with reference to FIG. 8.

Figure 8:
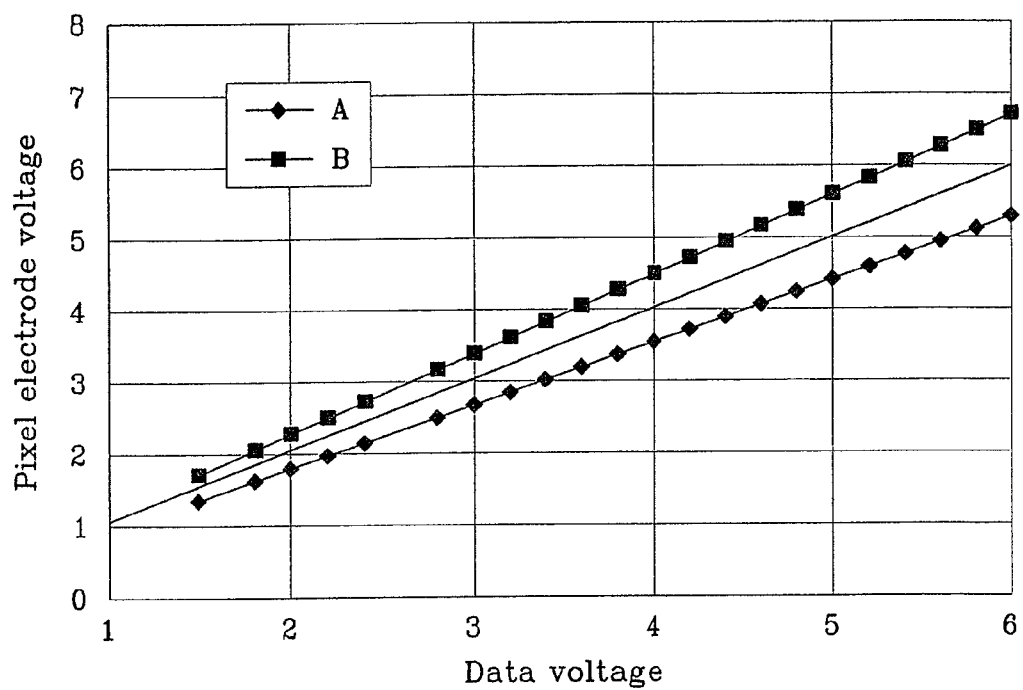
FIG. 8 is a graph illustrating the voltages of the first and the second pixel electrodes of a LCD as function of a data voltage obtained by simulation, according to an embodiment of the present invention.

FIG. 8 is a graph illustrating the voltages of the first and the second pixel electrodes of a LCD as function of a data voltage obtained by simulation, according to an embodiment of the present invention. The characters A and B in the legend indicate the voltages of the first and the second pixel electrodes 190a and 190b, respectively.

As shown in FIG. 8, when the data voltage is equal to 2V, the voltage difference between the first and the second pixel electrodes 190a and 190b is equal to about 0.59V. When the data voltage is equal to about 5.0 V, the voltage difference is equal to about 1.19V. Similarly, when the data voltage equal to 5V, the voltage drop of the first pixel electrode 190a is equal to about 0.55V, and the voltage raise of the second pixel electrode 190b is equal to about 0.64V. In other embodiments, the voltage drop and the voltage raise may be adjusted by changing the capacitances or the area of the electrodes, as described above.

In one embodiment, under an optimal condition, the ratio of the area of the first pixel electrode 190a to the area of the second pixel electrode 190b is preferably in a range from about 50:50 to about 80:20, more preferably in a range from about 70:30 to about 80:20. Similarly the ratio of the voltage of the first pixel electrode 190a to the voltage of the second pixel electrode 190b is in a range from about 1:1.3 to about 1:1.5, which will be described in detail with reference to FIGS. 9 and 10.

Figure 9:
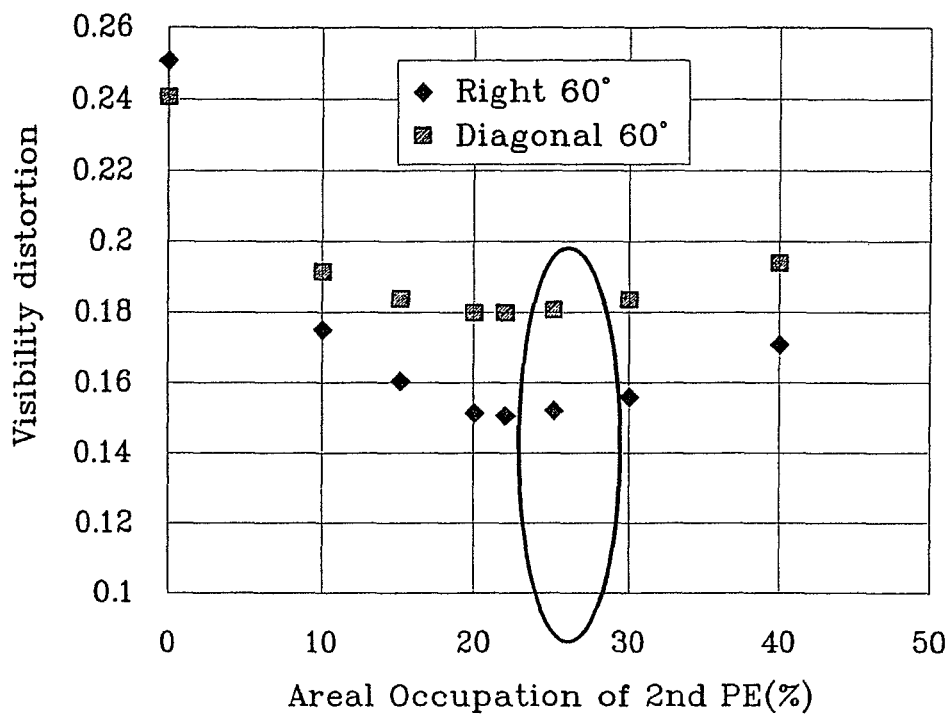
FIGS. 9 and 10 are graphs illustrating visibility distortion as function of an area occupied by the second pixel electrode (PE) and as a function of a voltage ratio of the second pixel electrode to the first pixel electrode in a LCD, which functions were obtained by simulation, according to an embodiment of the present invention.
Figure 10:
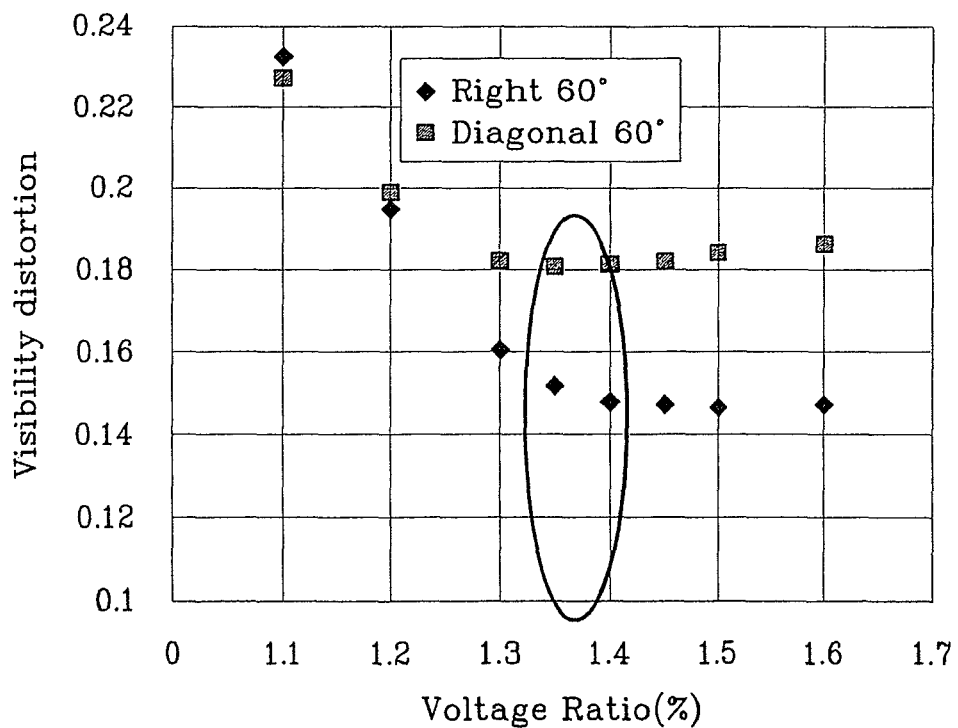

FIGS. 9 and 10 are graphs illustrating visibility distortion as function of a real occupation of (e.g., area occupied by) the second pixel electrode (PE) and voltage ratio of the second pixel electrode to the first pixel electrode in a LCD according to an embodiment of the present invention, respectively, which are obtained by simulations. The results shown were obtained for a viewing angle of 60 degrees at the right side and at the diagonal side.

As shown in FIG. 9, the visibility is minimally distorted for an a real occupation equal to about 20-30%. Accordingly, the ratio of the area of the first pixel electrode 190a to the second pixel electrode 190b preferably ranges from about 80:20 to about 70:30.

As shown in FIG. 10, the visibility distortion shows a minimum for a voltage ratio in an illustrative range of about 1.3-1.5.

Now, a principle of compensation of the distortion of gamma curves by providing two pixel electrodes having different voltages in a pixel is described in detail with reference to FIGS. 11A-11C.

Figure 11A:
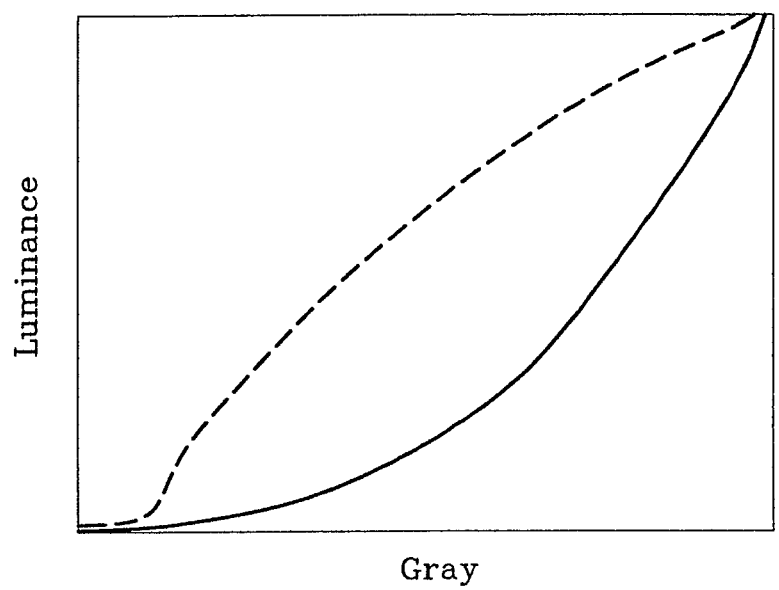
FIGS. 11A-11C are graphs illustrating front and lateral gamma curves for an undivided pixel, a bisected pixel including two subpixels having different voltages, and a trisected pixel including three subpixels having different voltages.
Figure 11B:
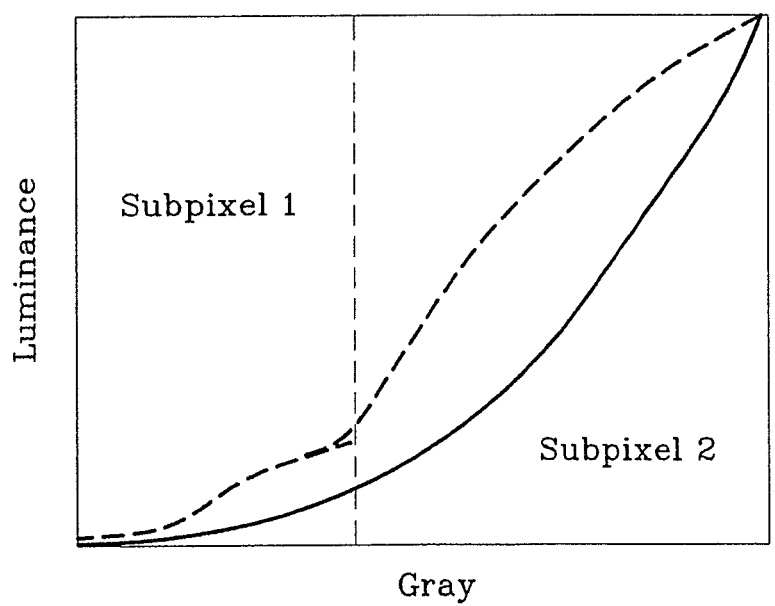
Figure 11C:
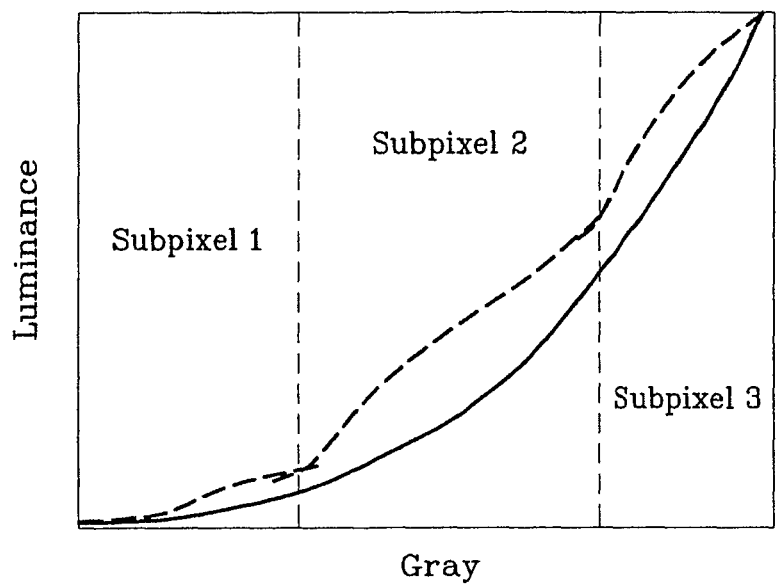

FIGS. 11A-11C are graphs illustrating front and lateral gamma curves for an undivided pixel, a bisected pixel including two subpixels having different voltages, and a trisected pixel including three subpixels having different voltages. The grays include first to 64th grays, and the front gamma curve is illustrated by a solid line, while the lateral gamma curve is illustrated by a dotted line.

The lateral gamma curve shown in FIG. 11A is severely distorted above the front gamma curve. In particular, the luminance at lower grays abruptly varies to cause severe distortion of the lateral gamma curve.

FIG. 11B represents data gathered from a bisected pixel that includes first and second LC capacitors capacitively coupled by a TFT or a coupling electrode. The first and the second LC capacitors charge voltages higher and lower than the data voltage subtracted by the common electrode, respectively. At lower grays, the second LC capacitor substantially maintains a black state and the first LC capacitor primarily contributes to images, thereby decreasing the luminance of the pixel (which is denoted by "Subpixel 1"). However, at higher grays, the second LC capacitor also contributes to images to increase the luminance of the pixel (which is denoted by "Subpixel 2"). Therefore, the distortion of the lateral gamma curve is reduced as shown in FIG. 11B.

Similarly, the distortion of the lateral gamma curve for a trisected pixel is much reduced as shown in FIG. 11C.

Figure 12:
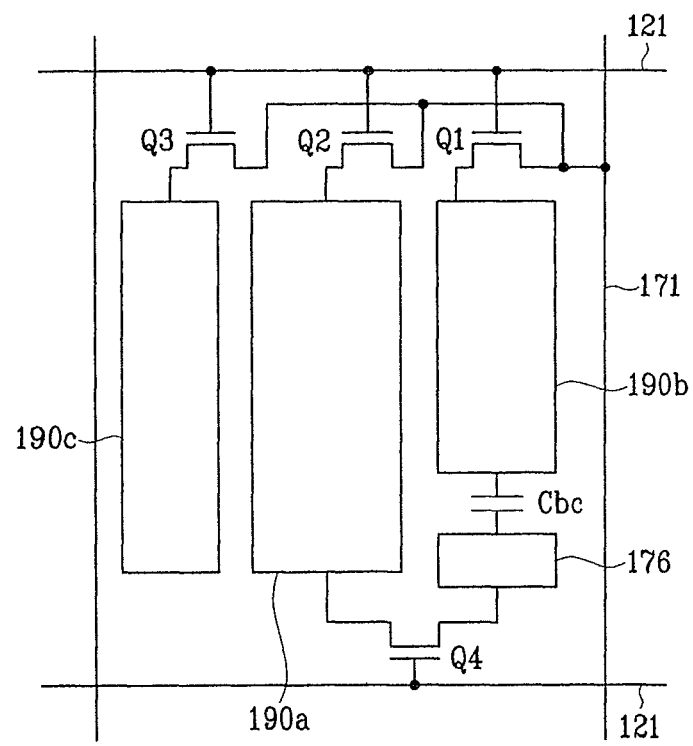
FIG. 12 is an equivalent circuit diagram of a TFT array panel including a trisected pixel of a LCD, according to an embodiment of the present invention.

FIG. 12 is an equivalent circuit diagram of a TFT array panel including a trisected pixel of a LCD according to an embodiment of the present invention. As depicted by FIG. 12, the TFT array panel includes a plurality of gate lines, a plurality of data lines, and a plurality of pixels. Each pixel includes first, second, and third second pixel electrodes 190a-190c, first, second, third, and fourth TFTs Q1-Q4, and a coupling electrode 176.

In one embodiment, the first/second/third TFTs Q1/Q2/Q3 are each connected to a gate line, a data line supplied with data voltages, and to each first/second/third pixel electrode 190a/190b/190c, respectively. The fourth TFT Q4 is connected to a gate line adjacent the gate line connected to the first to the third TFTs Q1-Q3. The TFT Q4 is also connected to the first pixel electrode 190a and the coupling electrode 176. The coupling capacitor electrode 176 is capacitively coupled to the second pixel electrode 190b to form a coupling capacitor Cbc.

In use, as described above with reference to FIG. 6, the magnitude of the voltage of the first pixel electrode 190a with respect to the common voltage becomes lower than the initial data voltage, while the magnitude of the voltage of the second pixel electrode 190b with respect to the common voltage becomes higher than the initial data voltage. However, the voltage of the third pixel remains approximately equal to the initial data voltage. Accordingly, the first to the third pixel electrodes 190a-190c have different voltages, thereby much reducing the distortion of gamma curves.

A TFT array panel for a LCD according to another embodiment of the present invention will be described in detail with reference to FIGS. 13-15.

Figure 13:
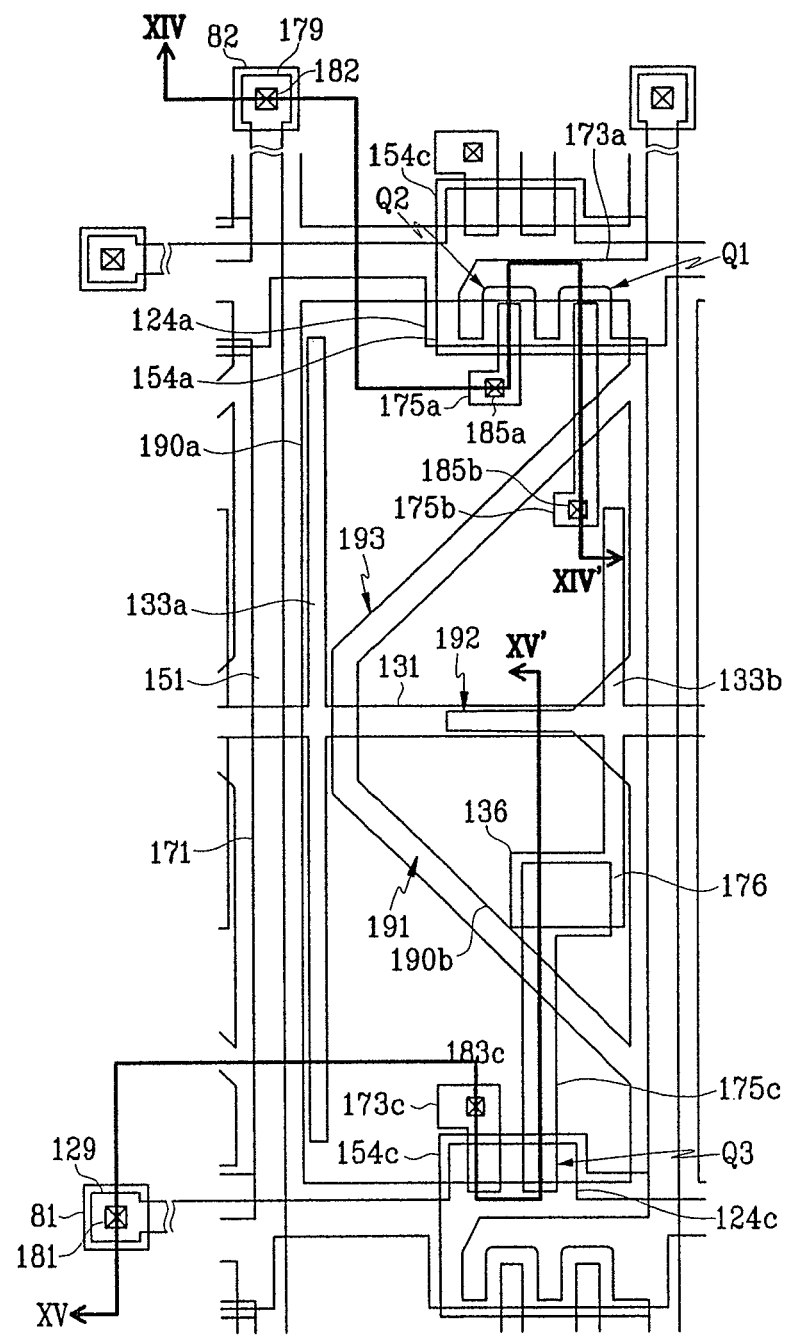
FIG. 13 is a top view of a TFT array panel for a LCD, according to another embodiment of the present invention.
Figure 14:
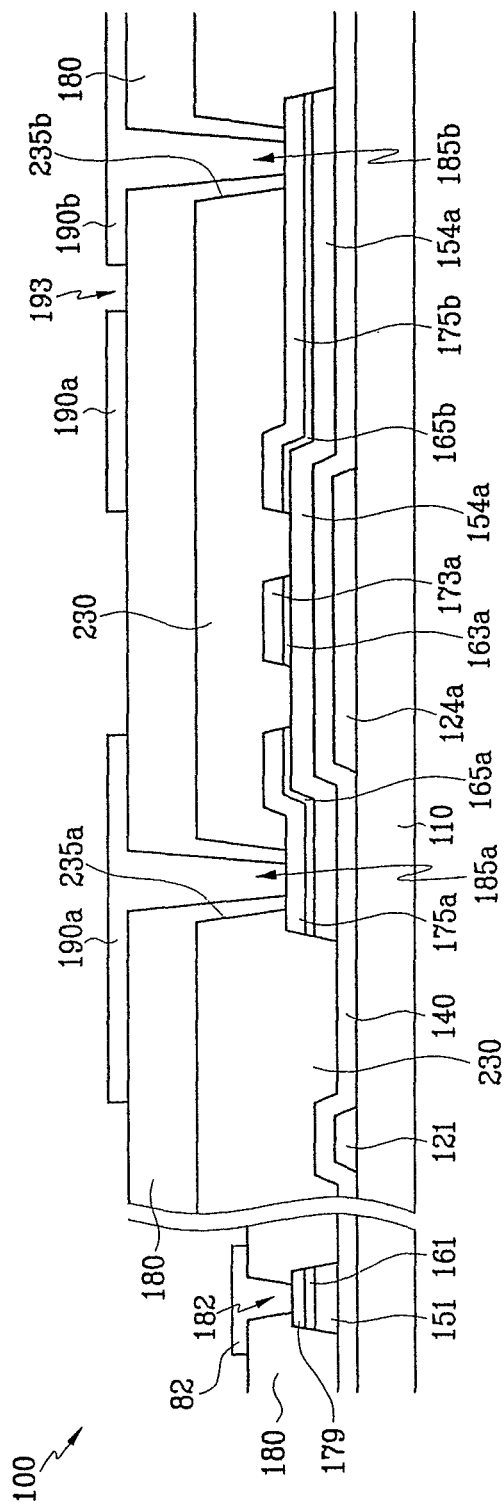
FIGS. 14 and 15 are sectional views of the TFT array panel shown in FIG. 13 taken along the lines XIV-XIV' and XV-XV', respectively.
Figure 15:
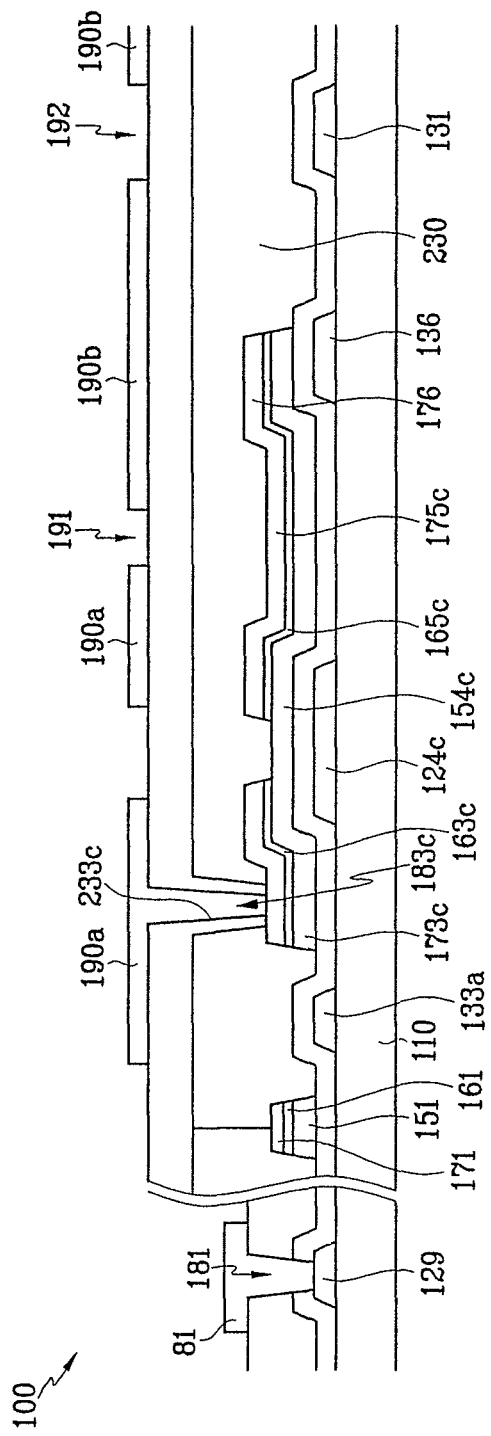

FIG. 13 is a top view of a TFT array panel for a LCD according to another embodiment of the present invention, and FIGS. 14 and 15 are sectional views of the TFT array panel shown in FIG. 13 taken along the lines XIV-XIV' and XV-XV', respectively.

A layered structure of the TFT array panel according to this embodiment is almost the same as those shown in FIGS. 1-5. Accordingly, gate lines 121 include a plurality of first gate electrodes 124a and second gate electrodes 124c. Storage electrode lines 131 include a plurality of storage electrodes 133a, 133b, and 133c. All these components are formed on a substrate 110, as shown. Also included on the substrate 110 are: gate insulating layer 140, a plurality of semiconductor strips 151 (including a plurality of projections 154a and 154c), and a plurality of ohmic contact strips 161 (including a plurality of projections 163a), and a plurality of ohmic contact islands 163c, and 165a-165c. A plurality of data lines 171 including a plurality of first source electrodes 173a, a plurality of second source electrodes 173c, and a plurality of first to third drain electrodes 175a, 175b, and 175c including coupling electrodes 176 are formed on the ohmic contacts 161, 163c and 165a-165c, respectively. A passivation layer 180 is formed over the data lines 171. A plurality of contact holes 182, 183c, 185a and 185b are provided at the passivation layer 180 and the gate insulating layer 140. Additionally, a plurality of pairs of pixel electrodes 190a and 190b, and a plurality of contact assistants 82 are formed on the passivation layer 180.

Different from the TFT array panel shown in FIGS. 1-5, the semiconductor strips 151 have almost the same planar shapes as the data lines 171, the source electrodes 173a and 173c, and the drain electrodes 175a-175c as well as the underlying ohmic contacts 161, 163c and 165a-165c. However, the projections 154a and 154c of the semiconductor strips 151 include some exposed portions, which are not covered with the data lines 171, etc., such as portions located between the source electrodes 173a and 173c and the drain electrodes 175a-175c.

Furthermore, each gate line 121 has an expanded end portion 129 having a large area for contact with another layer or an external device. Additionally, each gate insulating layer 140 and the passivation layer 180 have a plurality of contact holes 181 exposing the end portions 129 of the gate lines 121. A plurality of ohmic contacts 81 are formed on the passivation layer 180 and they contact the end portions 129 of the gate lines 121 through the contact holes 81.

Figure 17:
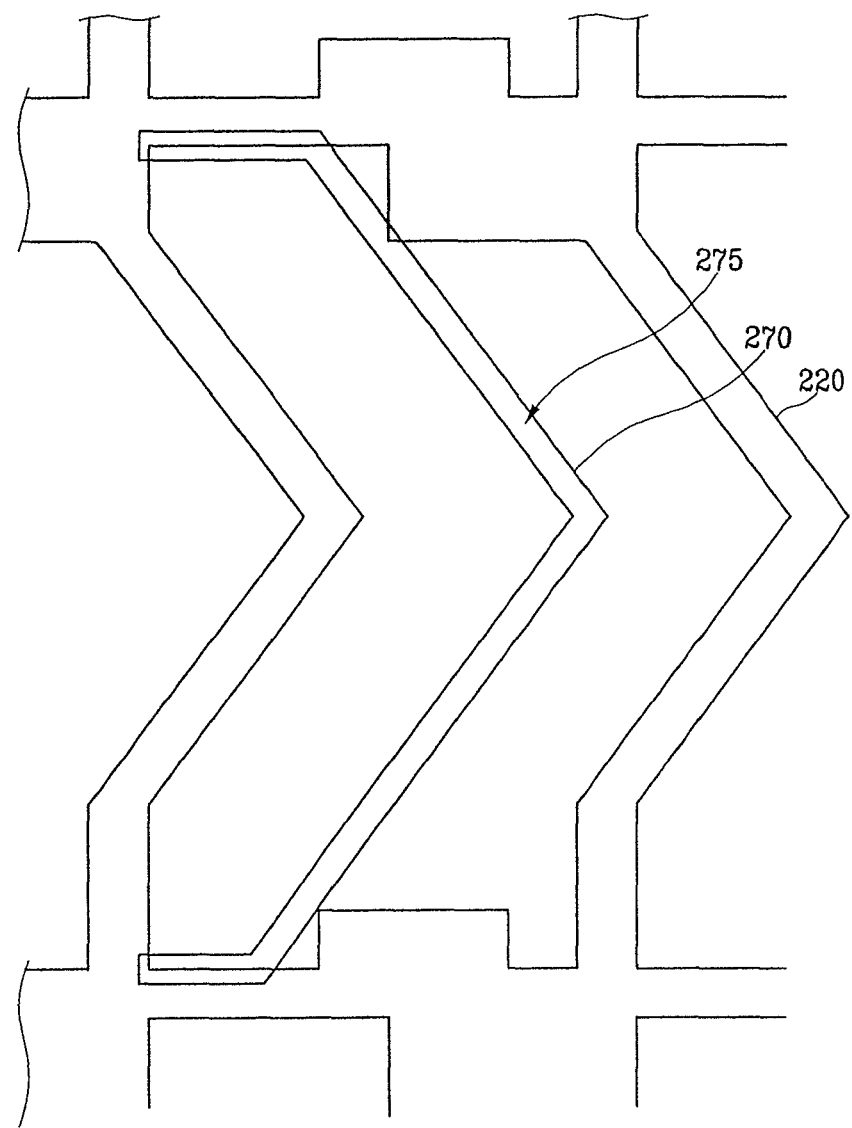
FIG. 17 is a top view of a common electrode panel for a LCD, according to another embodiment of the present invention.

In addition, the TFT array panel according to this embodiment provides a plurality of color filters 230 under the passivation layer 180. As shown in FIG. 17, each of the color filters 230 are disposed substantially on the pixel electrodes 190, and the color filters 230 in a column may be connected to form a strip. The color filters 230 have a plurality of openings 233c, 235a and 235b exposing the third source electrodes 183c, the first drain electrodes 175a, and the second drain electrodes 175b, respectively, and surrounding the contact holes 183c, 185a and 185b, respectively. The color filters 230 are not disposed on a peripheral area that is provided with the expanded end portions 129 of the gate lines 121 and the expanded end portions 179 of the data lines 171. Although FIG. 15 shows that edges of adjacent color filters 230 exactly match each other, the color filters 230 may overlap each other on the data lines 171 to enhance the light blocking. Alternatively, they may be spaced apart from each other. When the color filters 230 overlap each other, a light blocking film on a common electrode panel may be omitted.

A manufacturing method of the TFT array panel according to an embodiment simultaneously forms the data lines 171, the source electrodes 173a and 173c, the drain electrodes 175a-175c, the semiconductors 151, and the ohmic contacts 161, 163c, and 165a-165c using one photolithography process.

A photoresist pattern for the photolithography process has position-dependent thickness, and in particular, it has first and second portions with decreased thickness. The first portions are located on wire areas that will be occupied by the data lines 171, the source electrodes 173a and 173c, and the drain electrodes 175a-175c; and the second portions are located on channel areas of the TFTs Q1-Q3.

The position-dependent thickness of the photoresist is obtained by several techniques, for example, by providing translucent areas, as well as transparent areas, and light-blocking opaque areas on the exposure mask. The translucent areas may have a slit pattern, a lattice pattern, a thin film(s) with intermediate transmittance or intermediate thickness. When using a slit pattern, it is preferable that the width of the slits or the distance between the slits is smaller than the resolution of a light exposer used for the photolithography. In another embodiment, a reflowable resist may be used. For example, a photoresist pattern made of a reflowable material is formed using a normal exposure mask having only transparent areas and opaque areas. Thereafter, the reflowable material is subjected to a reflow process so that the material flows onto areas without the photoresist, thereby forming thin portions.

Using the embodiments of illustrative photoresists described above improves manufacturing methods by omitting a photolithography step.

Many of the above-described features of the LCD shown in FIGS. 1-5 may be included in the LCD shown in FIGS. 13-15.

Figure 16:
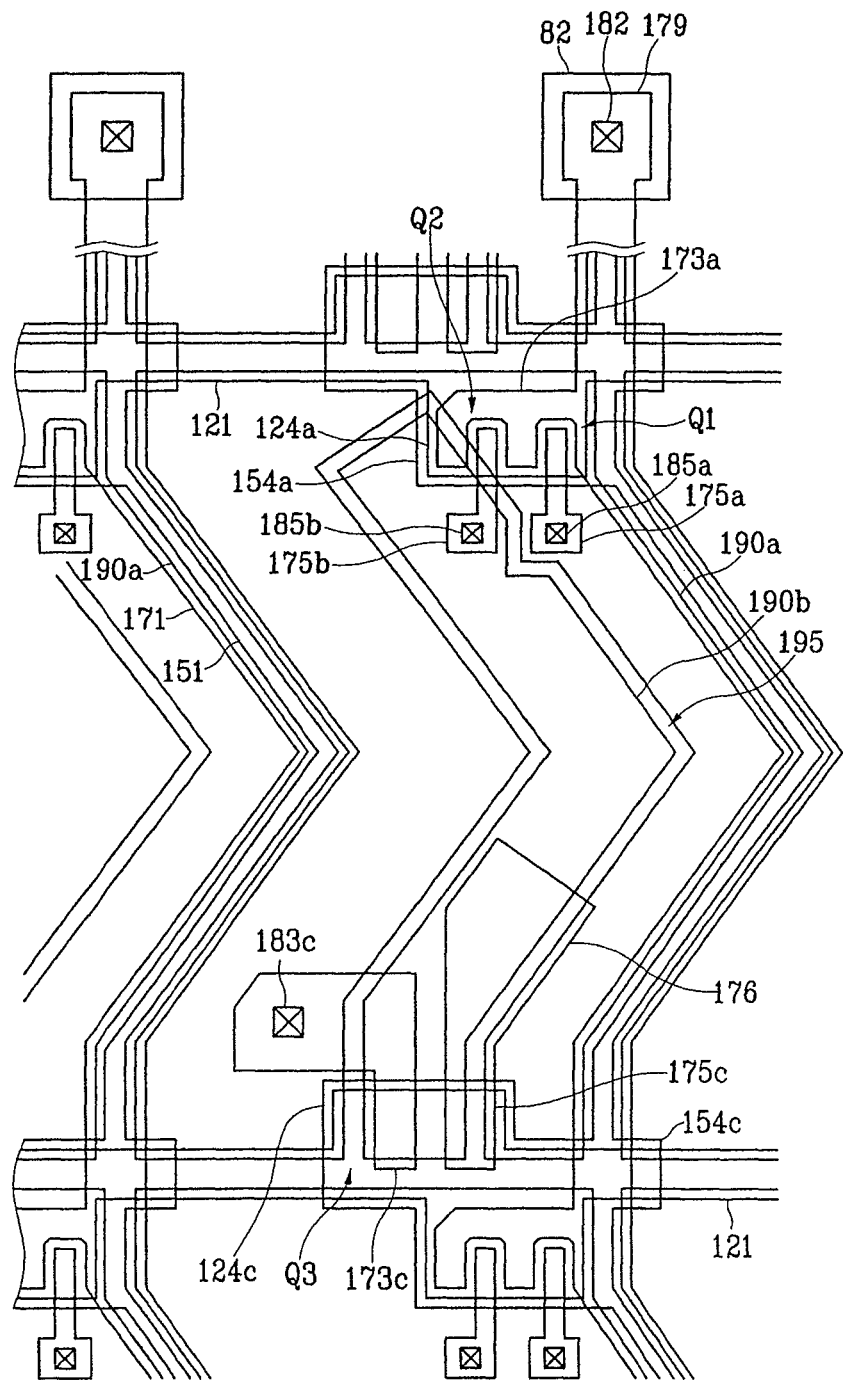
FIG. 16 is a top view of a TFT array panel for a LCD, according to another embodiment of the present invention.
Figure 18:
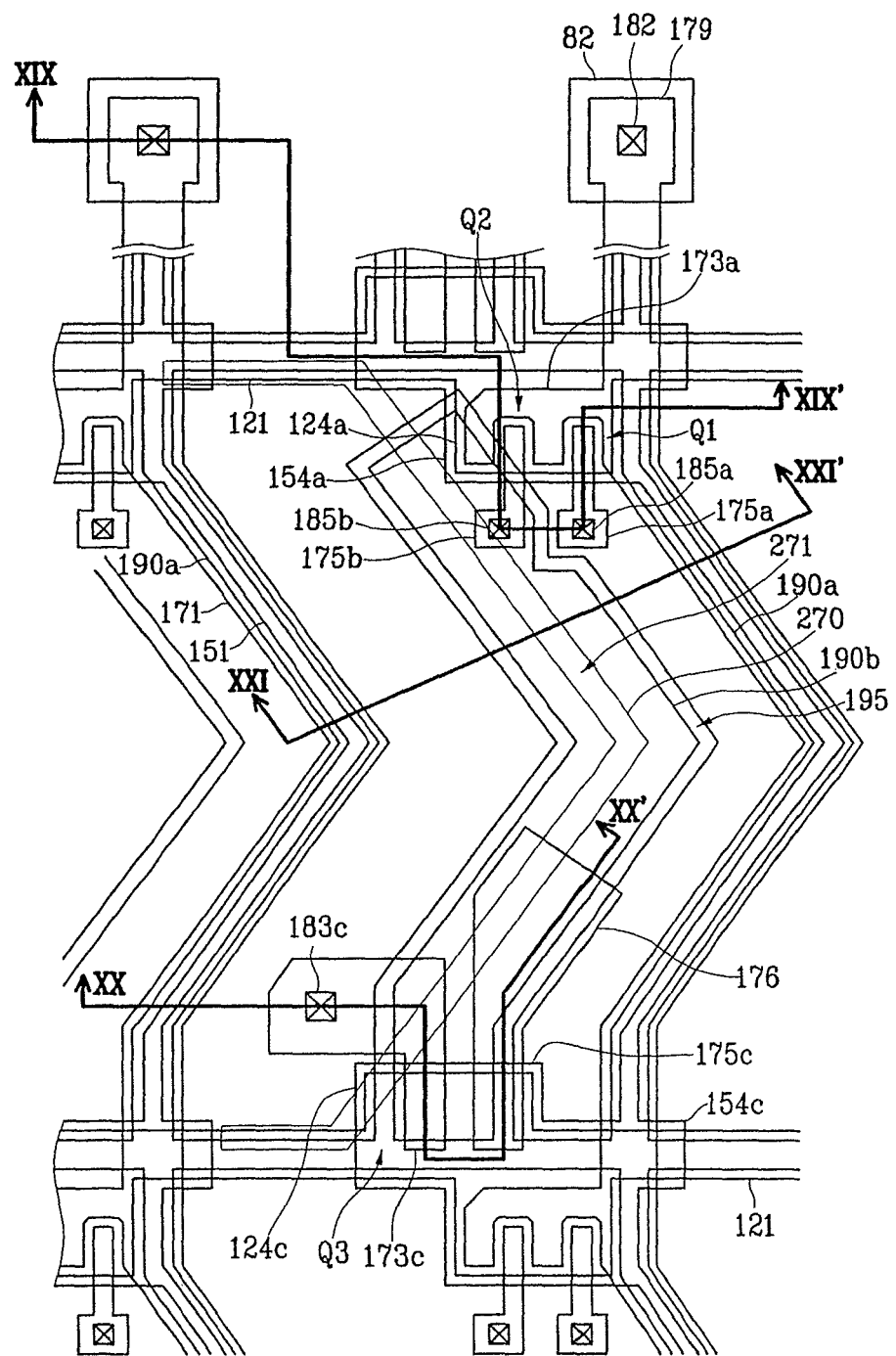
FIG. 18 is a top view of a LCD including the TFT array panel shown in FIG. 16 and the common electrode panel shown in FIG. 17.
Figure 19:
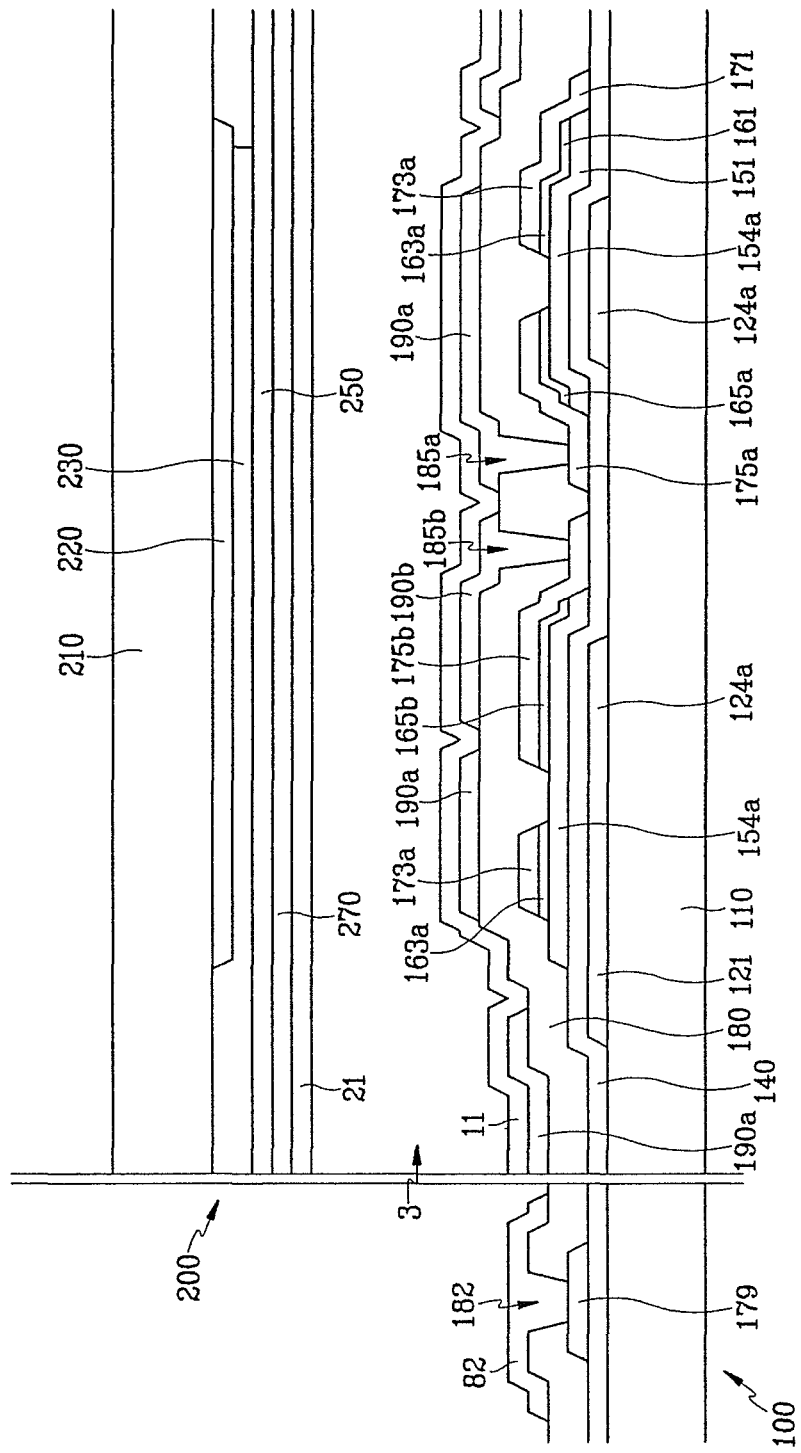
FIGS. 19-21 are sectional views of the LCD shown in FIG. 18 taken along the lines XIX-XIX', XX-XX', and XXI-XXI', respectively.
Figure 20:
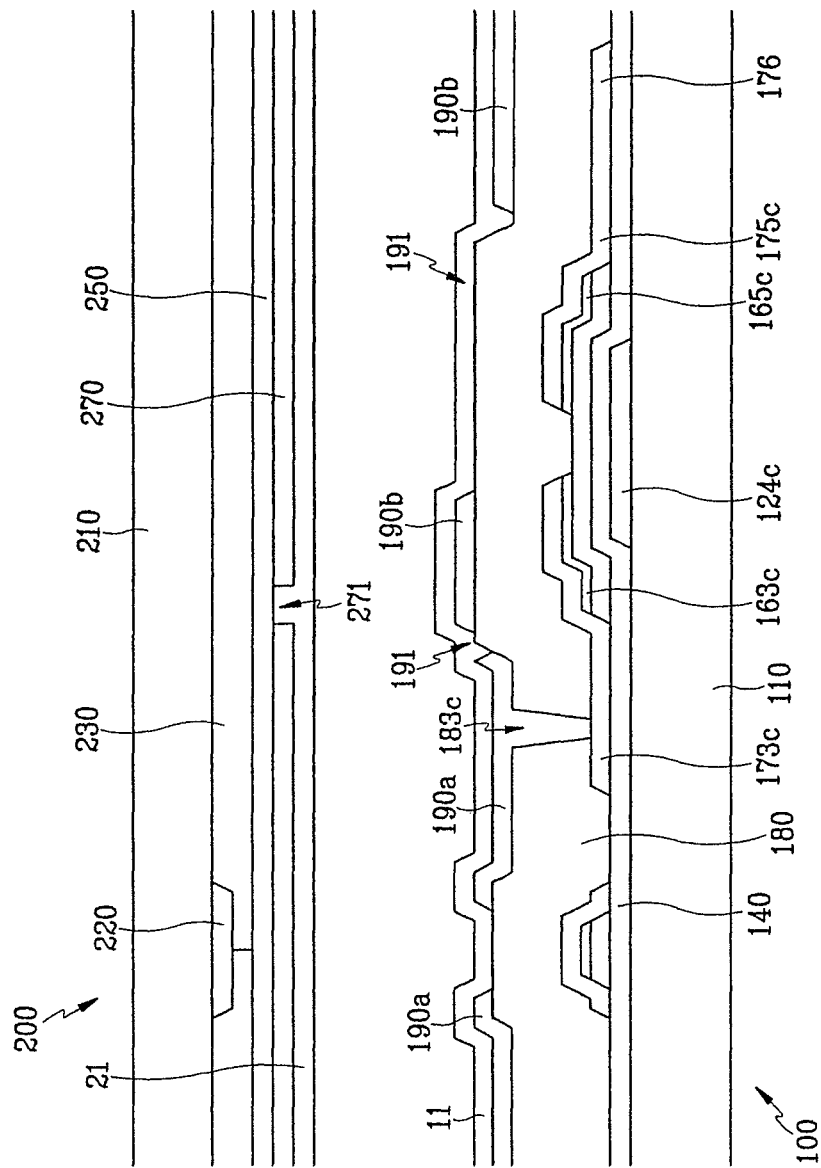
Figure 21:
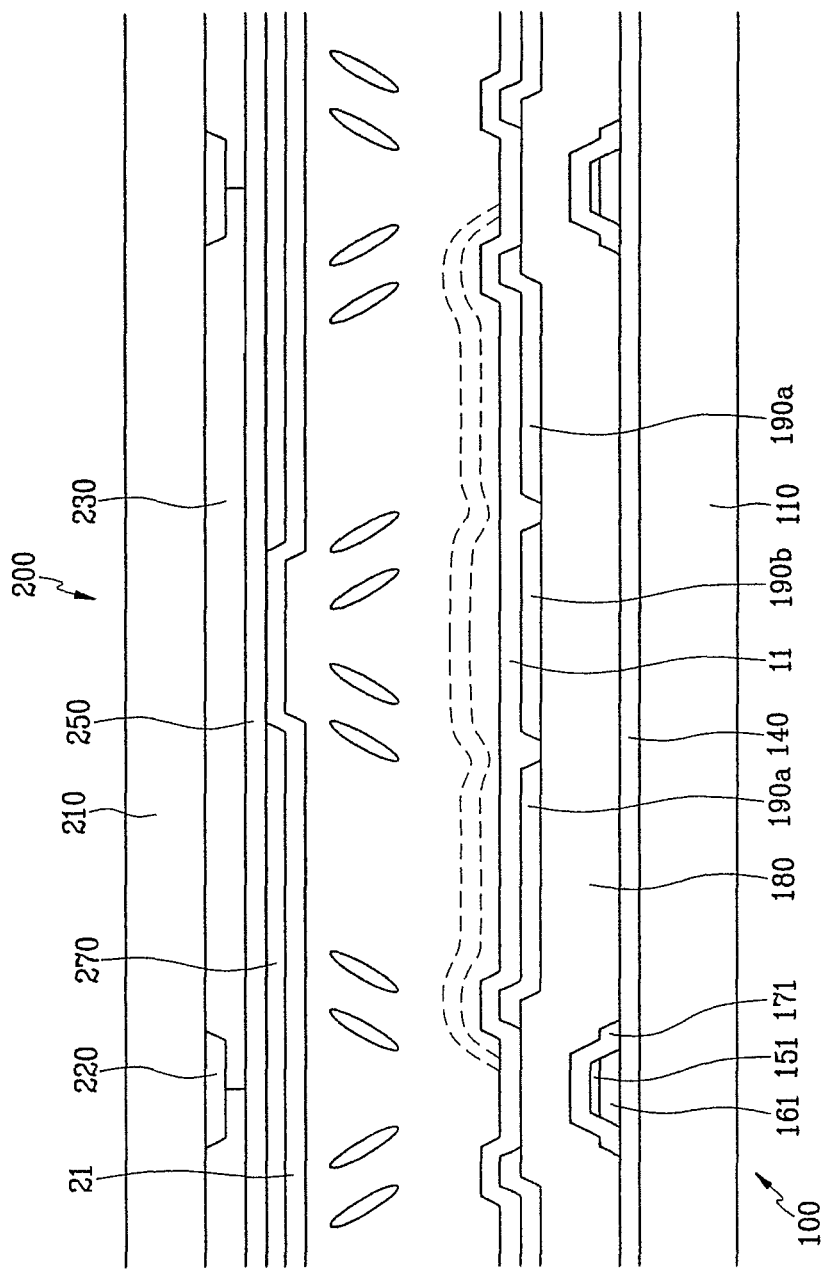

A LCD according to another embodiment of the present invention will be described in detail with reference to FIGS. 16-21. FIG. 16 is a top view of a TFT array panel for a LCD according to another embodiment of the present invention. FIG. 17 is a top view of a common electrode panel for a LCD according to another embodiment of the present invention. FIG. 18 is a top view of a LCD including the TFT array panel shown in FIG. 16 and the common electrode panel shown in FIG. 17. FIGS. 19-21 are sectional views of the LCD shown in FIG. 18 taken along the lines XIX-XIX', XX-XX', and XXI-XXI', respectively.

Referring to FIGS. 16-21, a LCD according to this embodiment also includes a TFT array panel 100, a common electrode panel 200, and a LC layer 3 interposed therebetween.

Layered structures of the panels 100 and 200 according to this embodiment are almost the same as those shown in FIGS. 1-5, and thus are not described again in detail, in order not to unnecessarily complicate the invention. However, a layout of the LCD according to this embodiment differs from the LCD shown in FIGS. 1-5.

For example, as shown, each data line 171 includes a plurality of pairs of oblique portions and a plurality of longitudinal portions such that it curves periodically. A pair of oblique portions are connected to each other to form a chevron and opposite ends of the pair of oblique portions are connected to respective longitudinal portions. The oblique portions of the data lines 171 make an angle of about 45 degrees with the gate lines 121, and the longitudinal portions cross over the gate lines 121 and include the first and the second source electrodes 173a and 173c projected toward the first and the second gate electrodes 124a and 124c. The length of a pair of oblique portions is about one to nine times the length of a longitudinal portion. In other words, a length of the longitudinal portion is about 50-90 percent of the total length of the pair of oblique portions. The number and the shape of the oblique portions connected between adjacent longitudinal portions may be variously modified.

Each pair of first and second pixel electrodes 190a and 190b may be located substantially in an area enclosed by the data lines 171 and the gate lines 121. The pixel electrodes also form a chevron having a plurality of outer edges including two pairs of oblique edges, two pairs of longitudinal edges, and a pair of transverse upper and lower edges.

In one embodiment, the second pixel electrode 190b is almost enclosed by the first pixel electrode 190a and is substantially equidistant from the opposite oblique outer edges of the above-described chevron. The second pixel electrodes 190b may have a shape of a narrow chevron that has (i) two pairs of oblique edges substantially parallel to the oblique portions of the data lines 171, (ii) a pair of longitudinal edges connected to one of the two pairs of oblique edges and substantially parallel to the longitudinal portions of the data lines 171, (iii) an oblique upper edge connected to the other of the two pairs of oblique edges and substantially perpendicular to the other pair of oblique edges, and (iv) a transverse lower edge connected to the pair of longitudinal edges and forming an outer boundary of the pair of first and second pixel electrodes 190a and 190b.

The first pixel electrode 190a may have a plurality of inner edges facing the oblique edges and the longitudinal edges of the second pixel electrode 190b.

Accordingly, a gap 195 between the first and the second pixel electrodes 190a and 190b may have a shape following the shape of the inner edges of the first and the second pixel electrodes 190a and 190b. In one embodiment, the gap 195 has a width preferably equal to about 2-5 microns.

Additionally, the oblique edges of the first and the second pixel electrodes disposed near the first drain electrodes 175a may be slightly curved along edges of the first drain electrodes 175a. The shape of the expansions of the second source electrodes 173b and the first and the second drain electrodes 175a and 175b may have a variety of modifications such as diamond and parallelogram. In particular, the expansions may have oblique edges parallel to the oblique portions of the data lines 171 and the oblique edges of the first and the second pixel electrodes 190a and 190b. For example, FIG. 16 shows that each of the second source electrodes 173c may include a rectangular expansion having a chamfered corner. FIG. 16 further shows that each coupling electrode 176 may have a pair of oblique edges parallel to an edge of the pixel electrodes 190a and 190b adjacent thereto and another oblique edge connected to the pair of oblique edges and perpendicular thereto.

The contact holes 182, 183c, 185a and 185b can have various shapes such as polygon or circle. The sidewalls of the contact holes 182, 183c, 185a and 185b may be inclined with an angle of about 30-80 degrees, or have stepwise profiles. Each contact hole 182 has an area preferably equal to or larger than about 0.5 mm.times.about 15 .mu.m and not larger than about 2 mm.times.about 60 .mu.m.

Although the TFT array panel shown in FIGS. 16-21 includes no storage electrode line, it may also include a plurality of storage electrode lines including storage electrodes having a various shape, which approximates the shape of the pixel electrodes 190a and 190b and the data lines 171.

In one embodiment, the common electrode 270 has a plurality of chevron-like cutouts 275. Each cutout 275 includes a pair of oblique portions connected to each other, a transverse portion connected to one of the oblique portions, and a longitudinal portion connected to the other of the oblique portions. The oblique portions of the cutout 275 may extend substantially parallel to the oblique portions of the data lines 171 and face a second pixel electrode 190b so that they may bisect each of the first and the second pixel electrodes 190a and 190b into substantially identical left and right halves. Each of the oblique portions of the cutout 275 may include a transverse branch (not shown) bisecting each of the left and the right halves into lower and upper quarters. The transverse and the longitudinal portions of the cutout 275 are aligned with transverse and longitudinal edges of the pixel electrode 190, respectively, and they may make obtuse angles with the oblique portions of the cutout 190. The cutouts 275 preferably have a width in a range about 9-12 microns, and may be substituted with protrusions preferably made of organic material and preferably having a width ranging about 5 microns to about 10 microns.

The light blocking member 220 may include a plurality of linear portions facing the gate lines 121 and the data lines 171. It may further include a plurality of rectangular portions facing the TFTs such that the light blocking member 220 prevents light leakage between the pixel electrodes 190 and defines open areas facing the pixel electrodes 190.

The color filters 230 may be disposed substantially in the open areas defined by the light blocking member 220 and thus they may also have a chevron-like shape. Additionally, the color filters 230 disposed in two adjacent data lines 171 arranged in the longitudinal direction may be connected to each other to form a strip.

In use, when a common voltage is applied to the common electrode 270 and a data voltage is applied to the pixel electrodes 190a and 190b of the LCD, a primary electric field is generated that is substantially perpendicular to the surfaces of the panels 100 and 200. The LC molecules respond to the electric field by changing their orientations, such that their long axes become positioned perpendicular to the direction of the electric field. In the meantime, the cutouts 275 of the common electrode 270 and the outer edges of the pixel electrodes 190a and 190b distort the primary electric field to have a horizontal component which determines the tilt directions of the LC molecules. The horizontal component of the primary electric field is perpendicular to the edges of the cutouts 275 and the outer edges of the pixel electrodes 190a and 190b.

Accordingly, four sub-regions having different tilt directions are formed in a pixel region of the LC layer 3, in which the pixel electrodes 190a and 190b are located. Illustratively, the four sub-regions are partitioned by (i) outer edges of a pair of pixel electrodes 190*a* and 190*b*, (ii) a cutout 275 bisecting the pixel electrodes 190*a* and 190*b*, and (iii) an imaginary transverse center line passing through the meeting point of the oblique portions of the cutout 275. In one embodiment, each sub-region has two major edges defined by the cutout 275 and an oblique outer edge of the pixel electrodes 190*a* and 190*b*, respectively. The sub-regions are classified into a plurality of domains based on the tilt directions. In one embodiment, four domains are preferably used.

Because the voltage of the second pixel electrode 190*b* is higher than that of the first pixel electrode 190*a*, a horizontal component is generated in the electric field near the gap 195. In one embodiment, this horizontal component points the same direction as a horizontal component of the electric field near an adjacent outer edge of the first pixel electrode 190*a*. Accordingly, the horizontal component near the gap 195 enhances determination of the tilt directions of the LC molecules in the sub-region and reduces response time without generating light leakage near the gaps 275. In one embodiment, gap 195 also reduces the aperture ratio. Depending its geometry, gap 195 may generate a horizontal component of the electric field, which is parallel or antiparallel to the tilt directions of the LC molecules in the subregion.

In one embodiment, the direction of a secondary electric field due to the voltage difference between adjacent first pixel electrodes 190*a* may be perpendicular to the edges of the cutouts 275. If so, the direction of the secondary electric field will coincide with the direction of the horizontal component of the primary electric field. Consequently, the secondary electric field formed between the first pixel electrodes 190*a* should enhance determination of the tilt directions of the LC molecules.

FIG. 21 shows resultant equipotential lines depicted in dotted lines, which are obtained by simulation.

Since the LCD performs inversion such as dot inversion, column inversion, etc., adjacent pixel electrodes are supplied with data voltages having opposite polarity with respect to the common voltage. Consequently, a secondary electric field between the adjacent pixel electrodes is almost always generated to enhance the stability of the domains.

Since the tilt directions of all domains make an angle of about 45 degrees with the gate lines 121, which are parallel to or perpendicular to the edges of the panels 100 and 200, and the 45-degree intersection of the tilt directions and the transmissive axes of the polarizers gives maximum transmittance, the polarizers can be attached such that the transmissive axes of the polarizers are parallel to or perpendicular to the edges of the panels 100 and 200. This reduces production costs.

The LCD shown in FIGS. 16-21 can have several modifications.

For example, the pixel electrodes 190 as well as the common electrode 270 may have cutouts (not shown) for generating fringe field. Furthermore, the cutouts may be substituted with protrusions disposed on the common electrode 270 or the pixel electrodes 190*a* and 190*b*.

The shapes and the arrangements of the cutouts or the protrusions may be varied depending on the design factors such as the size of pixels, the ratio of the width and the length of the pixel electrodes 190*a* and 190*b*, the type and characteristics of the liquid crystal layer 3, and so on.

Many of the above-described features of the LCD shown in FIGS. 1-5 may be made to the LCD shown in FIGS. 16-21.

A TFT array panel for a LCD according to another embodiment of the present invention will be described in detail with reference to FIGS. 22-24.

Figure 22:
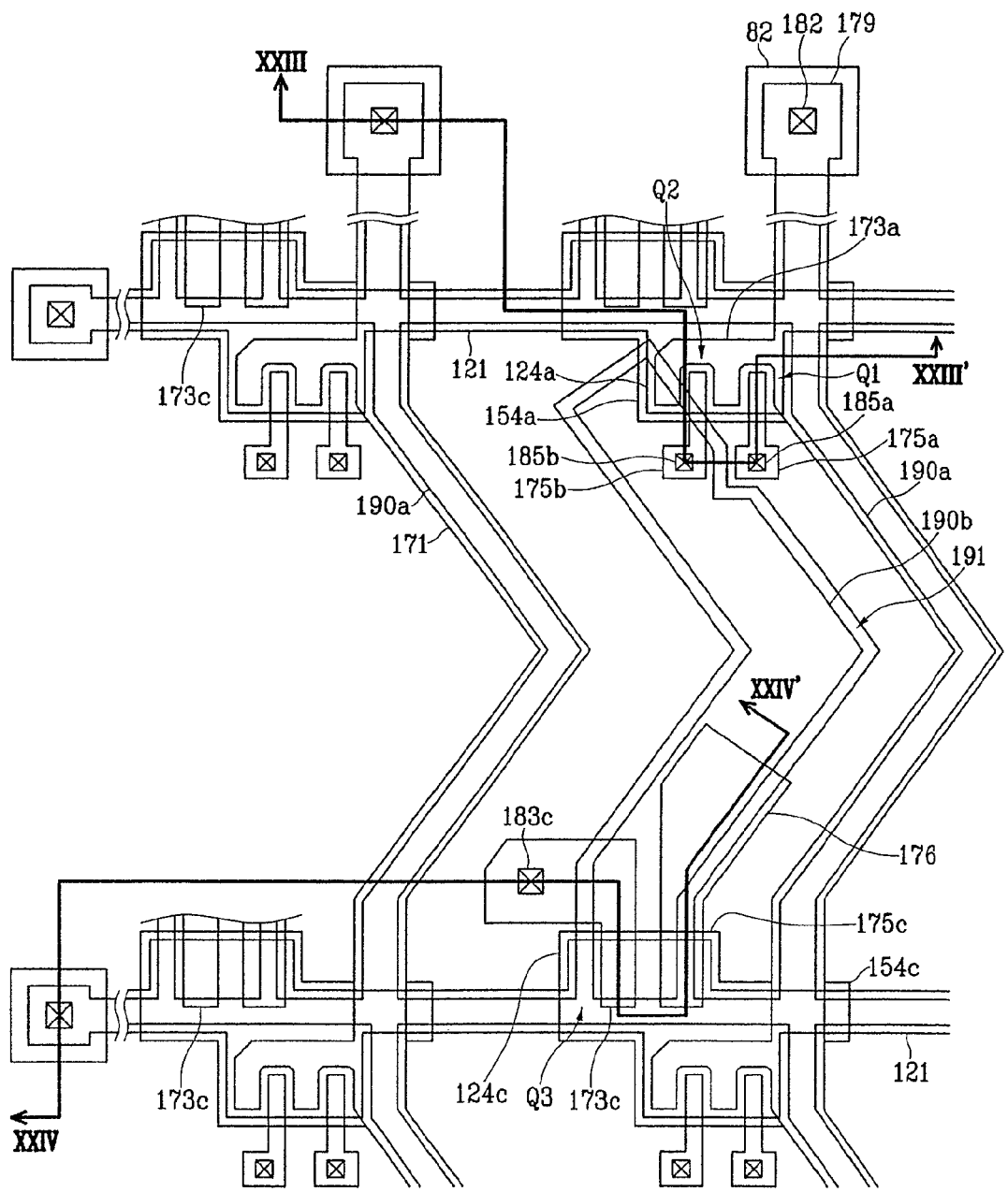
FIG. 22 is a top view of a TFT array panel for a LCD, according to another embodiment of the present invention.
Figure 23:
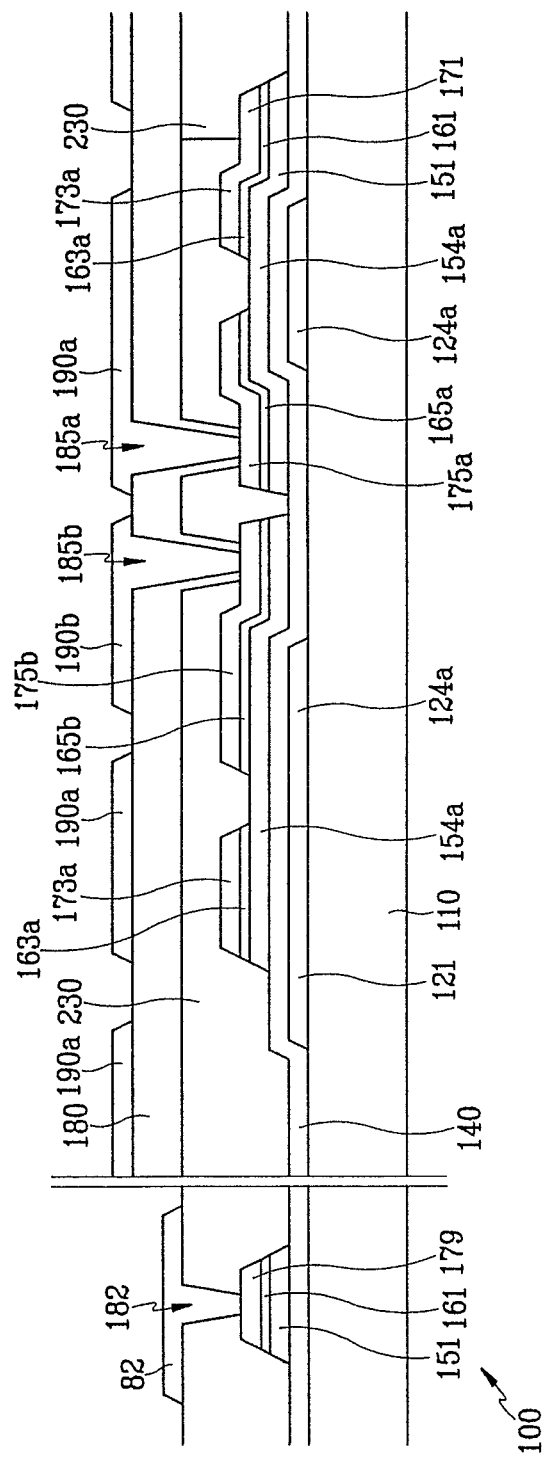
FIGS. 23 and 24 are sectional views of the TFT array panel shown in FIG. 22 taken along the lines XXIII-XXIII' and XXIV-XXIV', respectively.
Figure 24:
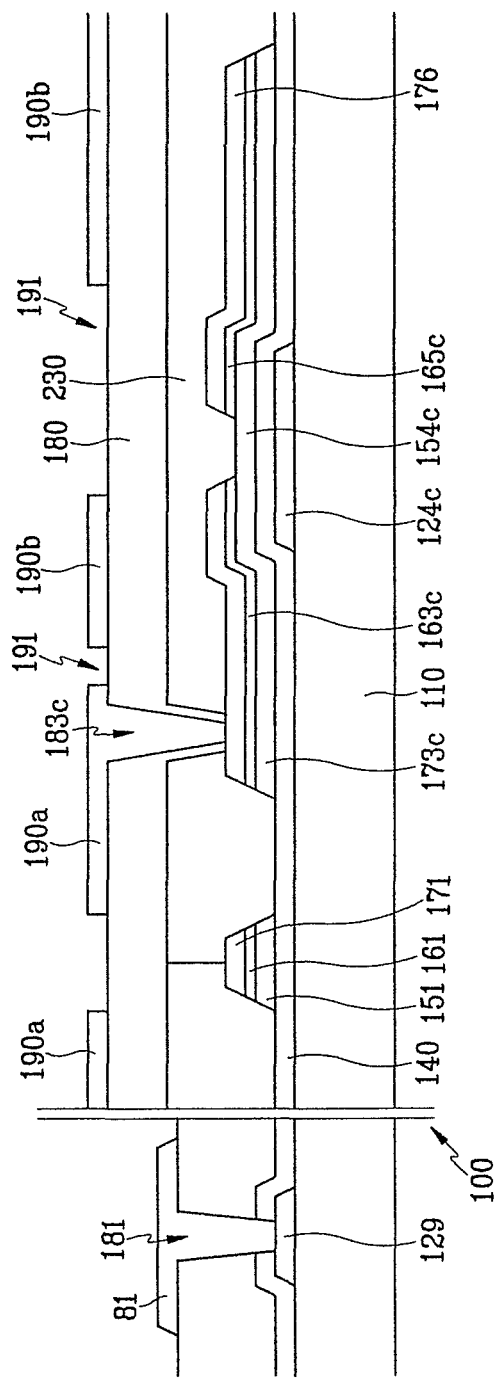

FIG. 22 is a top view of a TFT array panel for a LCD according to another embodiment of the present invention, and FIGS. 23 and 24 are sectional views of the TFT array panel shown in FIG. 22 taken along the lines XXIII-XXIII' and XXIV-XXIV', respectively.

A layered structure and a layout of the TFT array panel according to this embodiment is almost the same as those shown in FIGS. 16-21.

As illustratively shown, a plurality of gate lines 121 that include a plurality of first gate electrodes 124*a* and second gate electrodes 124*c* are formed on a substrate 110. A gate insulating layer 140, a plurality of semiconductor strips 151 that include a plurality of projections 154*a* and 154*c* is also formed on the substrate. Thereafter, a plurality of ohmic contact strips 161 including a plurality of projections 163*a*, and a plurality of ohmic contact islands 163*c*, and 165*a*-165*c* are formed on the substrate. As previously described, a plurality of data lines 171 (including a plurality of first source electrodes 173*a*), a plurality of second source electrodes 173*c*, and a plurality of first to third drain electrodes 175*a*-175*c* (including coupling electrodes 176) are formed on the ohmic contacts 161, 163*c* and 165*a*-165*c*, respectively. Additionally, a passivation layer 180 may be formed over the data lines. A plurality of contact holes 182, 183*c*, 185*a* and 185*b* may be provided at the passivation layer 180 and the gate insulating layer 140. Additionally, a plurality of pairs of pixel electrodes 190*a* and 190*b* separated by a gap 195, and a plurality of contact assistants 82 may be formed on the passivation layer 180.

Different from the TFT array panel shown in FIGS. 16-21, the semiconductor strips 151 have almost the same planar shapes as the data lines 171, the source electrodes 173*a* and 173*c*, and the drain electrodes 175*a*-175*c* as well as the underlying ohmic contacts 161, 163*c* and 165*a*-165*c*. However, the projections 154*a* and 154*c* of the semiconductor strips 151 include some exposed portions, which are not covered with the data lines 171, etc., such as portions located between the source electrodes 173*a* and 173*c* and the drain electrodes 175*a*-175*c*.

Furthermore, each gate line 121 has an expanded end portion 129 having a large area for contact with another layer or an external device, and the gate insulating layer 140 and the passivation layer 180 have a plurality of contact holes 181 exposing the end portions 129 of the gate lines 121. A plurality of ohmic contacts 81 formed on the passivation layer 180 contact the end portions 129 of the gate lines 121 through the contact holes 81.

In addition, the TFT array panel according to this embodiment provides a plurality of color filters 230 under the passivation layer 180. Each of the color filters 230 are disposed substantially on the pixel electrodes 190. Additionally, the color filters 230 in a column may be connected to form a strip. The color filters 230 may have a plurality of openings 233*c*, 235*a* and 235*b* exposing the third source electrodes 183*c*, the first drain electrodes 175*a*, and the second drain electrodes 175*b*, respectively, and surrounding the contact holes 183*c*, 185*a* and 185*b*, respectively. In one embodiment, the color filters 230 are not disposed on a peripheral area that is provided with the expanded end portions 129 and 179 of the gate lines 121 and the data lines 171. Although FIG. 23 shows that edges of adjacent color filters 230 exactly match each other, the color filters 230 may overlap each other on the data lines 171 to enhance the light blocking. Alternatively, they may be spaced apart from each other. When the color filters 230 overlap each other, a light blocking film on a common electrode panel may be omitted.

A manufacturing method of the TFT array panel according to an embodiment simultaneously forms the data lines 171, the source electrodes 173a and 173c, the drain electrodes 175a-175c, the semiconductors 151, and the ohmic contacts 161, 163c and 165a-165c using one photolithography process.

For example, a photoresist pattern for the photolithography process has position-dependent thickness. In one embodiment, the photoresist pattern has first and second portions with decreased thickness. The first portions may be located on wire areas that will be occupied by the data lines 171, the source electrodes 173a and 173c, and the drain electrodes 175a-175c. The second portions may be located on channel areas of TFTs Q1-Q3.

As a result, the manufacturing process is simplified by omitting a photolithography step.

Many of the above-described features of the LCD shown in FIGS. 16-21 may be included in the LCD shown in FIGS. 22-24.

While the present invention has been described in detail with reference to the preferred embodiments, those skilled in the art will appreciate that various modifications and substitutions can be made thereto without departing from the spirit and scope of the present invention as set forth in the appended claims.

What is claimed is:

1. A flat panel display, comprising:
   a substrate;
   a gate line disposed on the substrate;
   a signal line extended substantially parallel to the gate line;
   a data line intersecting the gate line;
   a first sub pixel electrode and a second sub pixel electrode disposed on the substrate;
   a first thin film transistor comprising a first terminal connected to the gate line, a second terminal connected to the data line, and a third terminal connected to the first sub pixel electrode;
   a second thin film transistor comprising a first terminal connected to the gate line, a second terminal connected to the data line, and a third terminal connected to the second sub pixel electrode; and
   a third thin film transistor comprising a first terminal connected to the signal line, a second terminal connected to the first sub pixel electrode, and a third terminal connected to a coupling electrode;
   wherein the coupling electrode does not overlap the first sub pixel electrode and the second sub pixel electrode.

2. The first panel display of claim 1, further comprising a storage electrode pattern disposed on a same layer as the gate line, wherein the coupling electrode overlaps a portion of the storage electrode pattern.

3. The flat panel display of claim 2, wherein a capacitance between the coupling electrode and the storage electrode pattern is different from a capacitance between the first sub pixel electrode and the storage electrode pattern.

4. The flat panel display of claim 3, wherein the capacitance between the coupling electrode and the storage electrode pattern ranges from about $1/10$ to about $1/3$ of the capacitance between the first sub pixel electrode and the storage electrode pattern.

5. The flat panel display of claim 1, wherein the signal line is electrically connected to another gate line adjacent to the gate line.

6. The flat panel display of claim 1, wherein a ratio of a voltage of the first sub pixel electrode to a voltage of a third sub pixel electrode is in a range from about 1:1.3 to about 1:1.5, wherein the third sub pixel electrode is connected to the data line and the coupling electrode.

7. The flat panel display of claim 1, wherein a ratio of the area of the first sub pixel electrode to the area of a third sub pixel electrode is in a range from about 50:50 to about 80:20, wherein the third sub pixel electrode is connected to the data line and the coupling electrode.

8. The flat panel display of claim 1, wherein the first sub pixel electrode has a domain divider.

9. The flat panel display of claim 1, wherein a parasitic capacitance between the signal line and the third terminal of the third thin film transistor is larger than a parasitic capacitance between the gate line and a third terminal of a fourth thin film transistor comprising a first terminal connected to the gate line, a second terminal connected to the data line, and the third terminal connected to a third sub pixel electrode.

* * * * *